US012791631B2

(12) United States Patent
Shier et al.

(10) Patent No.: US 12,791,631 B2
(45) Date of Patent: Nov. 10, 2026

(54) BINARY SCAN SYSTEM FOR LEAKAGE DETECTION IN WIRE HARNESSES

(71) Applicant: DIT-MCO International LLC, Kansas City, MO (US)

(72) Inventors: David Alan Shier, Lee's Summit, MO (US); Scott F. Ruland, Kansas City, MO (US)

(73) Assignee: DIT-MCO International LLC, Kansas City, MO (US)

( * ) Notice: Subject to any disclaimer, the term of this patent is extended or adjusted under 35 U.S.C. 154(b) by 188 days.

(21) Appl. No.: 18/917,780

(22) Filed: Oct. 16, 2024

(65) Prior Publication Data

US 2025/0130291 A1 Apr. 24, 2025

Related U.S. Application Data

(60) Provisional application No. 63/555,335, filed on Feb. 19, 2024, provisional application No. 63/544,871, filed on Oct. 19, 2023.

(51) Int. Cl.
*G01R 31/58* (2020.01)
*G01R 1/067* (2006.01)

(52) U.S. Cl.
CPC ......... *G01R 31/58* (2020.01); *G01R 1/06766* (2013.01)

(58) Field of Classification Search
CPC G01R 31/58; G01R 1/06766; G01R 31/1272; G01R 31/68; G01R 31/007
USPC .................................................. 324/500–537
See application file for complete search history.

(56) References Cited

U.S. PATENT DOCUMENTS

| | | | | |
|---|---|---|---|---|
| 5,250,908 | A * | 10/1993 | Liu | G01R 31/67 324/763.01 |
| 7,112,969 | B1 * | 9/2006 | Thomas | G01R 31/58 324/503 |
| 12,618,873 | B1 * | 5/2026 | Shier | G01R 1/206 |
| 2002/0171434 | A1 | 11/2002 | Stanford et al. | |
| 2021/0247463 | A1 | 8/2021 | Shier | |
| 2025/0347735 | A1 * | 11/2025 | Shier | G01R 31/2844 |

OTHER PUBLICATIONS

"Extended European Search Report," for European Patent Application No. 24207583.6 mailed Mar. 5, 2025 (7 pages).

* cited by examiner

*Primary Examiner* — Arleen M Vazquez
(74) *Attorney, Agent, or Firm* — Pauly, De Vries Smith and Deffner LLC

(57) ABSTRACT

Various embodiments provide a system for analyzing an electrical wiring harness assembly. The system can include a harness interface for contacting pins of the electrical wiring harness. The system can include a stimulus and measurement device connected to the harness interface and configured to measure electrical characteristics of the electrical wiring harness assembly. The system can include a processing element in communication with the stimulus and measurement device. The processing element can be configure to divide the plurality of networks into a first portion and a second portion of networks, initiate an electrical signal to the first portion of the networks, measure the electrical signal at the second portion of the networks, compare the measured electrical signal at the second portion of the networks to an expected electrical signal to determine a difference, and if the difference is greater than a threshold difference, record an error.

20 Claims, 19 Drawing Sheets

Example 1: No Failures

| Step | Result | Network 1 | Network 2 | Network 3 | Network 4 | Network 5 | Network 6 | Network 7 | Network 8 |
|---|---|---|---|---|---|---|---|---|---|
| 1 | Pass | 1 | 1 | 1 | 1 | 2 | 2 | 2 | 2 |
| 2 | Pass | 1 | 1 | 2 | 2 | 1 | 1 | 2 | 2 |
| 3 | Pass | 1 | 2 | 1 | 2 | 1 | 2 | 1 | 2 |

FIG. 10

Example 2: Failure between 4 & 8

| Step | Result | Network 1 | Network 2 | Network 3 | Network 4 | Network 5 | Network 6 | Network 7 | Network 8 |
|---|---|---|---|---|---|---|---|---|---|
| 1 | Fail | 1 | 1 | 1 | 1 | 2 | 2 | 2 | 2 |
| 2 | Pass | 1 | 1 | | | 2 | 2 | 2 | 2 |
| 3 | Pass | | | 1 | | 2 | 2 | 2 | 2 |
| 4 | Fail | | | | 1 | 2 | 2 | 2 | 2 |
| 5 | Pass | | | | 1 | 2 | 2 | | |
| 6 | Pass | | | | 1 | | | 2 | |
| 7 | Fail | | | | 1 | | | | 2 |
| 8 | Pass | 2 | 2 | 2 | 1 | | | | |
| 9 | Pass | 1 | 1 | 1 | | 2 | 2 | 2 | 2 |
| 10 | Pass | 1 | 1 | 2 | | 1 | 1 | 2 | 2 |
| 11 | Pass | 1 | 2 | 1 | | 1 | 2 | 1 | 2 |

FIG. 11

Example 3: Failure between 1 & 8

| Step | Result | Network 1 | Network 2 | Network 3 | Network 4 | Network 5 | Network 6 | Network 7 | Network 8 |
|---|---|---|---|---|---|---|---|---|---|
| 1 | Fail | 1 | 1 | 1 | 1 | 2 | 2 | 2 | 2 |
| 2 | Fail | 1 | 1 | | | 2 | 2 | 2 | 2 |
| 3 | Fail | 1 | | | | 2 | 2 | 2 | 2 |
| 4 | Pass | 1 | | | | 2 | 2 | | |
| 5 | Pass | 1 | | | | | | 2 | |
| 6 | Fail | 1 | | | | | | | 2 |
| 7 | Pass | 1 | 2 | 2 | 2 | | | | |
| 8 | Pass | | 1 | 1 | 1 | 2 | 2 | 2 | 2 |
| 9 | Pass | | 1 | 2 | 2 | 1 | 1 | 2 | 2 |
| 10 | Pass | | 2 | 1 | 2 | 1 | 2 | 1 | 2 |

FIG. 12

Example 4: Failure between 2 & 4

| Step | Result | Network 1 | Network 2 | Network 3 | Network 4 | Network 5 | Network 6 | Network 7 | Network 8 |
|---|---|---|---|---|---|---|---|---|---|
| 1 | Pass | 1 | 1 | 1 | 1 | 2 | 2 | 2 | 2 |
| 2 | Fail | 1 | 1 | 2 | 2 | 1 | 1 | 2 | 2 |
| 3 | Fail | 1 | 1 | 2 | 2 | | | 2 | 2 |
| 4 | Pass | 1 | | 2 | 2 | | | 2 | 2 |
| 5 | Fail | | 1 | 2 | 2 | | | 2 | 2 |
| 6 | Fail | | 1 | 2 | 2 | | | | |
| 7 | Pass | | 1 | 2 | | | | | |
| 8 | Fail | | 1 | | 2 | | | | |
| 9 | Pass | 2 | 1 | | | | | | |
| 10 | Pass | 1 | | 2 | 2 | 1 | 1 | 2 | 2 |
| 11 | Pass | 1 | | 1 | 2 | 1 | 2 | 1 | 2 |

FIG. 13

Example 5: Failure between 5 & 8

| Step | Result | Network 1 | Network 2 | Network 3 | Network 4 | Network 5 | Network 6 | Network 7 | Network 8 |
|---|---|---|---|---|---|---|---|---|---|
| 1 | Pass | 1 | 1 | 1 | 1 | 2 | 2 | 2 | 2 |
| 2 | Fail | 1 | 1 | 2 | 2 | 1 | 1 | 2 | 2 |
| 3 | Pass | 1 | 1 | 2 | 2 | | | 2 | 2 |
| 4 | fail | | | 2 | 2 | 1 | | 2 | 2 |
| 5 | Pass | | | 2 | 2 | 1 | | | |
| 6 | Pass | | | | | 1 | | 2 | |
| 7 | Fail | | | | | 1 | | | 2 |
| 8 | Pass | | | | | 1 | 2 | | |
| 9 | Pass | 1 | 1 | 2 | 2 | | 1 | 2 | 2 |
| 10 | Pass | 1 | 2 | 1 | 2 | | 2 | 1 | 2 |

FIG. 14

Example 6: Failure between 1 & 2

| Step | Result | Network 1 | Network 2 | Network 3 | Network 4 | Network 5 | Network 6 | Network 7 | Network 8 |
|---|---|---|---|---|---|---|---|---|---|
| 1 | Pass | 1 | 1 | 1 | 1 | 2 | 2 | 2 | 2 |
| 2 | Pass | 1 | 1 | 2 | 2 | 1 | 1 | 2 | 2 |
| 3 | Fail | 1 | 2 | 1 | 2 | 1 | 2 | 1 | 2 |
| 4 | Fail | 1 | 2 | 1 | 2 | | 2 | | 2 |
| 5 | Fail | 1 | 2 | | 2 | | 2 | | 2 |
| 6 | Fail | 1 | 2 | | 2 | | | | |
| 7 | Fail | 1 | 2 | | | | | | |
| 8 | Pass | | 2 | 1 | 2 | 1 | 2 | 1 | 2 |

FIG. 15

Example 7: Failures between 2 & 6 and 4 & 8

| Step | Result | Network 1 | Network 2 | Network 3 | Network 4 | Network 5 | Network 6 | Network 7 | Network 8 |
|---|---|---|---|---|---|---|---|---|---|
| 1 | Fail | 1 | 1 | 1 | 1 | 2 | 2 | 2 | 2 |
| 2 | Fail | 1 | 1 | | | 2 | 2 | 2 | 2 |
| 3 | Pass | 1 | | | | 2 | 2 | 2 | 2 |
| 4 | Fail | | 1 | | | 2 | 2 | 2 | 2 |
| 5 | Fail | | 1 | | | 2 | 2 | | |
| 6 | Pass | | 1 | | | 2 | | | |
| 7 | Fail | | 1 | | | | 2 | | |
| 8 | Pass | 2 | 1 | 2 | 2 | | | 2 | 2 |
| 9 | Fail | 1 | | 1 | 1 | 2 | 2 | 2 | 2 |
| 10 | Pass | 1 | | | | 2 | 2 | 2 | 2 |
| 11 | Fail | | | 1 | 1 | 2 | 2 | 2 | 2 |
| 12 | Pass | | | 1 | | 2 | 2 | 2 | 2 |
| 13 | Fail | | | | 1 | 2 | 2 | 2 | 2 |
| 14 | Pass | | | | 1 | 2 | 2 | | |
| 15 | Pass | | | | 1 | | | 2 | |
| 16 | Fail | | | | 1 | | | | 2 |
| 17 | Pass | 2 | | 2 | 1 | | | | |
| 18 | Pass | 1 | | 1 | | 2 | 2 | 2 | 2 |
| 19 | Pass | 1 | | 2 | | 1 | 1 | 2 | 2 |
| 20 | Pass | 1 | | 1 | | 1 | 2 | 1 | 2 |

FIG. 16

Example 8: Failure between 1 & 8 and 3 & 8

| Step | Result | Network 1 | Network 2 | Network 3 | Network 4 | Network 5 | Network 6 | Network 7 | Network 8 |
|---|---|---|---|---|---|---|---|---|---|
| 1 | Fail | 1 | 1 | 1 | 1 | 2 | 2 | 2 | 2 |
| 2 | Fail | 1 | 1 | | | 2 | 2 | 2 | 2 |
| 3 | Fail | 1 | | | | 2 | 2 | 2 | 2 |
| 4 | Pass | 1 | | | | 2 | 2 | | |
| 5 | Pass | 1 | | | | | | 2 | |
| 6 | Fail | 1 | | | | | | | 2 |
| 7 | Pass | 1 | 2 | 2 | 2 | | | | |
| 8 | Fail | | 1 | 1 | 1 | 2 | 2 | 2 | 2 |
| 9 | Pass | | 1 | | | 2 | 2 | 2 | 2 |
| 10 | Fail | | | 1 | | 2 | 2 | 2 | 2 |
| 11 | Pass | | | 1 | | 2 | 2 | | |
| 12 | Pass | | | 1 | | | | 2 | |
| 13 | Fail | | | 1 | | | | | 2 |
| 14 | Pass | | 1 | | 1 | 2 | 2 | 2 | 2 |
| 15 | Pass | | 1 | | 2 | 1 | 1 | 2 | 2 |
| 16 | Pass | | 2 | | 2 | 1 | 2 | 1 | 2 |

FIG. 17

Example 9: No Failures - Phantom Error

| Step | Result | Network 1 | Network 2 | Network 3 | Network 4 | Network 5 | Network 6 | Network 7 | Network 8 |
|---|---|---|---|---|---|---|---|---|---|
| 1 | Fail | 1 | 1 | 1 | 1 | 2 | 2 | 2 | 2 |
| 2 | Pass | 1 | 1 | | | 2 | 2 | 2 | 2 |
| 3 | Pass | | | 1 | | 2 | 2 | 2 | 2 |
| 4 | Pass | | | | 1 | 2 | 2 | 2 | 2 |

FIG. 18

Example 10: No Failures - Phantom Error

| Step | Result | Network 1 | Network 2 | Network 3 | Network 4 | Network 5 | Network 6 | Network 7 | Network 8 |
|---|---|---|---|---|---|---|---|---|---|
| 1 | Fail | 1 | 1 | 1 | 1 | 2 | 2 | 2 | 2 |
| 2 | Fail | 1 | 1 | | | 2 | 2 | 2 | 2 |
| 3 | Pass | 1 | | | | 2 | 2 | 2 | 2 |
| 4 | Pass | | 1 | | | 2 | 2 | 2 | 2 |
| 5 | Pass | | | 1 | | 2 | 2 | 2 | 2 |
| 6 | Pass | | | | 1 | 2 | 2 | 2 | 2 |

FIG. 19

BINARY SCAN SYSTEM FOR LEAKAGE DETECTION IN WIRE HARNESSES

RELATED APPLICATIONS

This application claims the benefit of U.S. Provisional Application No. 63/544,871, filed Oct. 19, 2023, and U.S. Provisional Application No. 63/555,335, filed Feb. 19, 2024, the content of which is incorporated herein by reference in its entirety.

TECHNICAL FIELD

Embodiments herein relate to systems and methods that analyze electrical wiring harness assemblies.

BACKGROUND OF THE INVENTION

In the manufacturing or installation of electrical wiring systems and harnesses, it is necessary to verify separate conductors (e.g., networks or circuits) are isolated from each other. Automatic test equipment (ATE) runs automated test scripts that include measuring electrical characteristics in order to predict continuity. ATE requires a plurality of interface adapters to connect to all the separate conductors to be tested simultaneously, such that a test script can run automatically with little or no operator intervention after the test is started.

Due to the configuration of existing systems, previous methods require detailed knowledge of the point-to-point wiring schematic of the wiring harness and can be only capable of testing limited wiring networks during each test scan, thus requiring one scan for every wiring network to test the complete system. This can result in an undesirable time-consuming process.

SUMMARY OF THE INVENTION

Various embodiments can provide a system for analyzing an electrical wiring harness assembly. The system can include (a) a harness interface for contacting two or more pins of the electrical wiring harness, wherein the electrical wiring harness includes a plurality of contacts, each contact is electrically connected to one of a plurality of networks, (b) a stimulus and measurement device connected to the harness interface and configured to measure electrical characteristics of the electrical wiring harness assembly, (c) a processing element in communication with the stimulus and measurement device, the processing element being configure to: i. divide the plurality of networks into a first portion of networks and a second portion of networks, ii. initiate an electrical signal to one of the first portion or the second portion of the networks, iii. measure the electrical signal at the other of the first portion or the second portion of the networks, iv. compare the measured electrical signal at the other of the first portion or the second portion of the networks to an expected electrical signal to determine a difference, and v. if the difference is greater than a threshold difference, record an error.

In an embodiment, the first portion of networks initially includes half of the plurality of networks and the second portion of networks initially includes the other half of the plurality of networks.

In an embodiment, the plurality of networks includes at least 100 networks.

In an embodiment, the processing element is further configured to display an error message on a user interface.

In an embodiment, the processing element is further configured to: retrieve an electrical schematic for a network having an error from a database of electrical schematics, and display the retrieved electrical schematic on the user interface.

In an embodiment, wherein, upon determining no error is present, the processing element is further configured to repeat the steps (i)-(iv) by continually dividing the plurality of networks into half first portion networks and half second portion networks, wherein each division of the plurality of networks includes a unique combination of networks in the first portion of networks and a unique combination of networks in the second portion of networks until each network is in a different portion from every other network at least one time for steps (ii)-(v).

In an embodiment, a network that is associated with a network that has previously been determined to have an error is removed from the plurality of networks that are divided into first portion networks and second portion networks for all subsequent repetitions of steps (i)-(v).

In an embodiment, wherein upon determining an error, the processing element is further configured to determine specifically which combination of networks produces the error.

In an embodiment, wherein upon determining an error, the processing element is further configured to determine specifically which combination of two networks produces the error.

In an embodiment, wherein upon determining an error, the processing element is configured to: vi. divide the plurality of second portions into a first half of second portion of networks and a second half of second portion of networks, vii. initiate an electrical signal to the first half of the second portion of the networks, viii. measure the electrical signal at the first portion of the networks, ix. compare the measured electrical signal at the first portion of the networks to an expected electrical signal to determine a difference, and x. if the difference is greater than a threshold difference, record an error.

In an embodiment, wherein upon determining no error exists between the first half of the second portion of the networks and the first portion of the networks, the second half of the second portion of the networks is evaluated against the first portions by having the processing element: xi. initiate an electrical signal to the second half of the second portion of the networks, xii. measuring the electrical signal at the first portion of the networks, xiii. comparing the measured electrical signal at the first portion of the contacts to an expected electrical signal to determine a difference, and xiv. if the difference is greater than a threshold difference, recording an error.

In an embodiment, wherein upon determining an error exists, the number of networks in the second portion of networks is reduced in half and steps (ii)-(v) are repeated.

In an embodiment, wherein upon determining no error exists in the most recent iteration of steps (ii)-(v), the networks in the second portion of networks that were used in the most recent iteration of steps (ii)-(v) are removed from consideration for subsequent iterations of steps (ii)-(v) until the error can be attributed to two specific networks.

In an embodiment, wherein upon determining that one specific second portion network is associated with the error, the processing element is configured to repeat the following steps until one specific first portion network is determined to be associated with the error: i. divide the plurality of first portion networks into a first half of first portion of networks and a second half of first portion of networks, ii. initiate an electrical signal to the one specific second portion network, iii. measure the electrical signal at the first half of first portion of the networks, iv. compare the measured electrical signal at the first half of first portion of the networks to an expected electrical signal to determine a difference, and v. if the difference is greater than a threshold difference, record an error vi. if no error is found, repeat steps (ii)-(v) with the second half of first portion of networks.

In an embodiment, the processor is configured to determine which additional network is associated with the error by comparing the one specific second portion network with half of the plurality of first portion of networks by repeating steps (ii)-(v), wherein if no error exists the first portions are removed from consideration and the one specific second portion network is compared with half of the remaining first portion networks.

In an embodiment, wherein each of the different network circuits is a circuit in an aerospace device.

In an embodiment, an error is representative of a failure of an insultation test or a hi-pot test.

In an embodiment, a system for analyzing an electrical wiring harness assembly, the system is included having (a) a harness interface for contacting two or more pins of the electrical wiring harness, wherein the electrical wiring harness includes a plurality of contacts, each contact is electrically connected to one of a plurality of networks, (b) a stimulus and measurement device connected to the harness interface and configured to measure electrical characteristics of the electrical wiring harness assembly, (c) a processing element in communication with the stimulus and measurement device, the processing element being configure to: i. divide the plurality of networks into an input portion of networks and an output portion of networks, ii. initiate an electrical signal to the output portion of the networks, iii. measure the electrical signal at the input portion of the networks, iv. compare the measured electrical signal at the input portion of the networks to an expected electrical signal to determine a difference, and v. record an error upon determining the difference is greater than a threshold difference.

In an embodiment, the input portion of networks initially includes half of the plurality of networks and the output portion of networks initially includes the other half of the plurality of networks.

In an embodiment, the plurality of networks includes at least 100 networks.

In an embodiment, the processing element is further configured to display an error message on a user interface.

In an embodiment, the processing element is further configured to: retrieve an electrical schematic for a network having an error from a database of electrical schematics, and display the retrieved electrical schematic on the user interface.

In an embodiment, wherein, upon determining no error is present, the processing element is further configured to repeat the steps (i)-(iv) by continually dividing the plurality of networks into half input portion networks and half output portion networks, wherein each division of the plurality of networks includes a unique combination of networks in the input portion of networks and a unique combination of networks in the output portion of networks until each network is in a different portion from every other network at least one time for steps (ii)-(v).

In an embodiment, a network that is associated with a network that has previously been determined to have an error is removed from the plurality of networks that are divided into input portion networks and output portion networks for all subsequent repetitions of steps (i)-(v).

In an embodiment, wherein upon determining an error, the processing element is further configured to determine specifically which combination of networks produces the error.

In an embodiment, wherein upon determining an error, the processing element is further configured to determine specifically which combination of two networks produces the error.

In an embodiment, wherein upon determining an error, the processing element is configured to: vi. divide the plurality of output portions into a first half of output portion of networks and a second half of output portion of networks, vii. initiate an electrical signal to the first half of the output portion of the networks, viii. measure the electrical signal at the input portion of the networks, ix. compare the measured electrical signal at the input portion of the networks to an expected electrical signal to determine a difference, and x. if the difference is greater than a threshold difference, record an error.

In an embodiment, wherein upon determining no error exists between the first half of the output portion of the networks and the input portion of the contacts, the second half of the output portion of the networks is evaluated against the input portions by having the processing element: xi. initiate an electrical signal to the second half of the output portion of the networks, xii. measuring the electrical signal at the input portion of the networks, xiii. comparing the measured electrical signal at the input portion of the contacts to an expected electrical signal to determine a difference, and xiv. if the difference is greater than a threshold difference, recording an error.

In an embodiment, wherein upon determining an error exists, the number of outputs is reduced in half and steps (ii)-(v) are repeated.

In an embodiment, wherein upon determining no error exists, the outputs used in the most recent iteration of steps (ii)-(v) are removed from consideration for subsequent iterations of steps (ii)-(v) until the error can be attributed to two specific networks.

In an embodiment, wherein upon determining that one specific output network is associated with the error, the processing element is configured to repeat the following steps until one specific input network is determined to be associated with the error: i. divide the plurality of input portions into a first half of input portion of networks and a second half of input portion of networks, ii. initiate an electrical signal to the one specific output network, iii. measure the electrical signal at the first half of input portion of the networks, iv. compare the measured electrical signal at the first half of input portion of the networks to an expected electrical signal to determine a difference, and v. if the difference is greater than a threshold difference, record an error vi. if no error is found, repeat steps (b)-(e) with the second half of input portion.

In an embodiment, the processor is configured to determine which additional network is associated with the error by comparing the one specific output contact with half of the plurality of input portion of contacts by repeating steps (b)-(e), wherein if no error exists the input portions are removed from consideration and the one specific output contact is compared with half of the remaining input portion contacts.

In an embodiment, wherein each of the different network circuits is a circuit in an aerospace device.

In an embodiment, an error is representative of a failure of an insultation test or a hipot test.

Various embodiments provide a system for analyzing an electrical wiring harness assembly. The system can include (a) a harness interface for contacting two or more pins of the electrical wiring harness, wherein the electrical wiring harness can include a first contact for an electrical connection to a first network, a second contact an electrical connection to a second network, a third contact an electrical connection to a third network, a fourth contact an electrical connection to a fourth network, a fifth contact an electrical connection to a fifth network, a sixth contact an electrical connection to a sixth network, a seventh contact an electrical connection to a seventh network, and an eighth contact an electrical connection to an eighth network, (b) a stimulus and measurement device connected to the harness interface and configured to measure electrical characteristics of the electrical wiring harness assembly, (c) a processing element in communication with the stimulus and measurement device, the processing element being configure to: i. set the first network, the second network, the third network, and the fourth network as output networks, and the fifth network, the sixth network, the seventh network and the eighth network as input network, ii. initiate an electrical signal to the output network, iii. measure the electrical signal at the input network, iv. compare the measured electrical signal at the input network to an expected electrical signal to determine a difference, and v. if the difference is greater than a threshold difference, record an error.

In an embodiment, wherein, upon determining no error exists, the processing element is further configured to: vi. set the first network, the second network, the fifth network, and the sixth network as output network, and the third network, the fourth network, the seventh network and the eighth network as input network, vii. initiate an electrical signal to the output network, viii. measure the electrical signal at the input network, ix. compare the measured electrical signal at the input network to an expected electrical signal to determine a difference, and x. if the difference is greater than a threshold difference, record an error.

In an embodiment, wherein, upon determining no error exists, the processing element is further configured to: xi. set the first network, the third network, the fifth network, and the seventh network as output network, and the second network, the fourth network, the sixth network and the eighth network as input network, xii. initiate an electrical signal to the output network, xiii. measure the electrical signal at the input network, xiv. compare the measured electrical signal at the input network to an expected electrical signal to determine a difference, xv. if the difference is greater than a threshold difference, record an error, and xvi. if no error exists, record a pass.

In an embodiment, wherein upon determining an error exists, the processing element is further configured to: xvii. set the first network and the second network as output networks, and the fifth network, the sixth network, the seventh network and the eighth network as input network, xviii. initiate an electrical signal to the output networks, xix. measure the electrical signal at the input networks, xx. compare the measured electrical signal at the input networks to an expected electrical signal to determine a difference, and xxi. if the difference is greater than a threshold difference, record an error.

In an embodiment, wherein upon determining an error does not exist when the first network and the second network are compared with the fifth, sixth, seventh, and eighth networks, the processing element is further configured to: xxii. set the third network as an output network, and the fifth network, the sixth network, the seventh network and the eighth network as input network, xxiii. initiate an electrical signal to the output network, xxiv. measure the electrical signal at the input networks, xxv. compare the measured electrical signal at the input networks to an expected electrical signal to determine a difference, and xxvi. if the difference is greater than a threshold difference, record an error.

In an embodiment, wherein upon determining an error does not exist when the third network is compared with the fifth, sixth, seventh, and eighth networks, the processing element is further configured to: xxvii. set the fourth network as an output network, and the fifth network, the sixth network, the seventh network and the eighth network as input network, xxviii. initiate an electrical signal to the output network, xxix. measure the electrical signal at the input networks, xxx. compare the measured electrical signal at the input networks to an expected electrical signal to determine a difference, and xxxi. if the difference is greater than a threshold difference, record an error.

In an embodiment, the processing element is further configured to: xxvii. set the fourth network as the output network, and the fifth and sixth networks as the input networks, xxviii. initiate an electrical signal to the output network, xxix. measure the electrical signal at the input networks, xxx. compare the measured electrical signal at the input network to an expected electrical signal to determine a difference, and xxxi. if the difference is greater than a threshold difference, record an error.

In an embodiment, wherein upon determining an error does not exist when the fourth network is compared with the fifth and sixth networks, the processing element is further configured to: xxxii. set the fourth network as the output network, and the seventh network as the input network, xxxiii. initiate an electrical signal to the output network, xxxiv. measure the electrical signal at the input network, xxxv. compare the measured electrical signal at the input network to an expected electrical signal to determine a difference, and xxxvi. if the difference is greater than a threshold difference, record an error.

In an embodiment, wherein upon determining an error does not exist when the fourth network is compared with the fifth and sixth networks, the processing element is further configured to: xxxvii. set the fourth network as the output network, and the eighth network as the input network, xxxviii. initiate an electrical signal to the output network, xxxix. measure the electrical signal at the input network, xl. compare the measured electrical signal at the input network to an expected electrical signal to determine a difference, and xli. if the difference is greater than a threshold difference, record an error.

In an embodiment, wherein upon determining an error exists when the fourth network is compared with the eighth network, the processing element is further configured to: xlii. set the first, second, and third networks as the output network, and the fourth network as the input network, xliii. initiate an electrical signal to the output network, xliv. measure the electrical signal at the input network, xlv. compare the measured electrical signal at the input network to an expected electrical signal to determine a difference, and xlvi. if the difference is greater than a threshold difference, record an error.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope herein is defined by the appended claims and their legal equivalents.

BRIEF DESCRIPTION OF THE FIGURES

Aspects may be more completely understood in connection with the following figures (FIGS.), in which:

FIG. 10 is a schematic of a testing routine in accordance with various embodiments herein.

FIG. 11 is a schematic of a testing routine in accordance with various embodiments herein.

FIG. 12 is a schematic of a testing routine in accordance with various embodiments herein.

FIG. 13 is a schematic of a testing routine in accordance with various embodiments herein.

FIG. 14 is a schematic of a testing routine in accordance with various embodiments herein.

FIG. 15 is a schematic of a testing routine in accordance with various embodiments herein.

FIG. 16 is a schematic of a testing routine in accordance with various embodiments herein.

FIG. 17 is a schematic of a testing routine in accordance with various embodiments herein.

FIG. 18 is a schematic of a testing routine in accordance with various embodiments herein.

FIG. 19 is a schematic of a testing routine in accordance with various embodiments herein.

Figure 1:
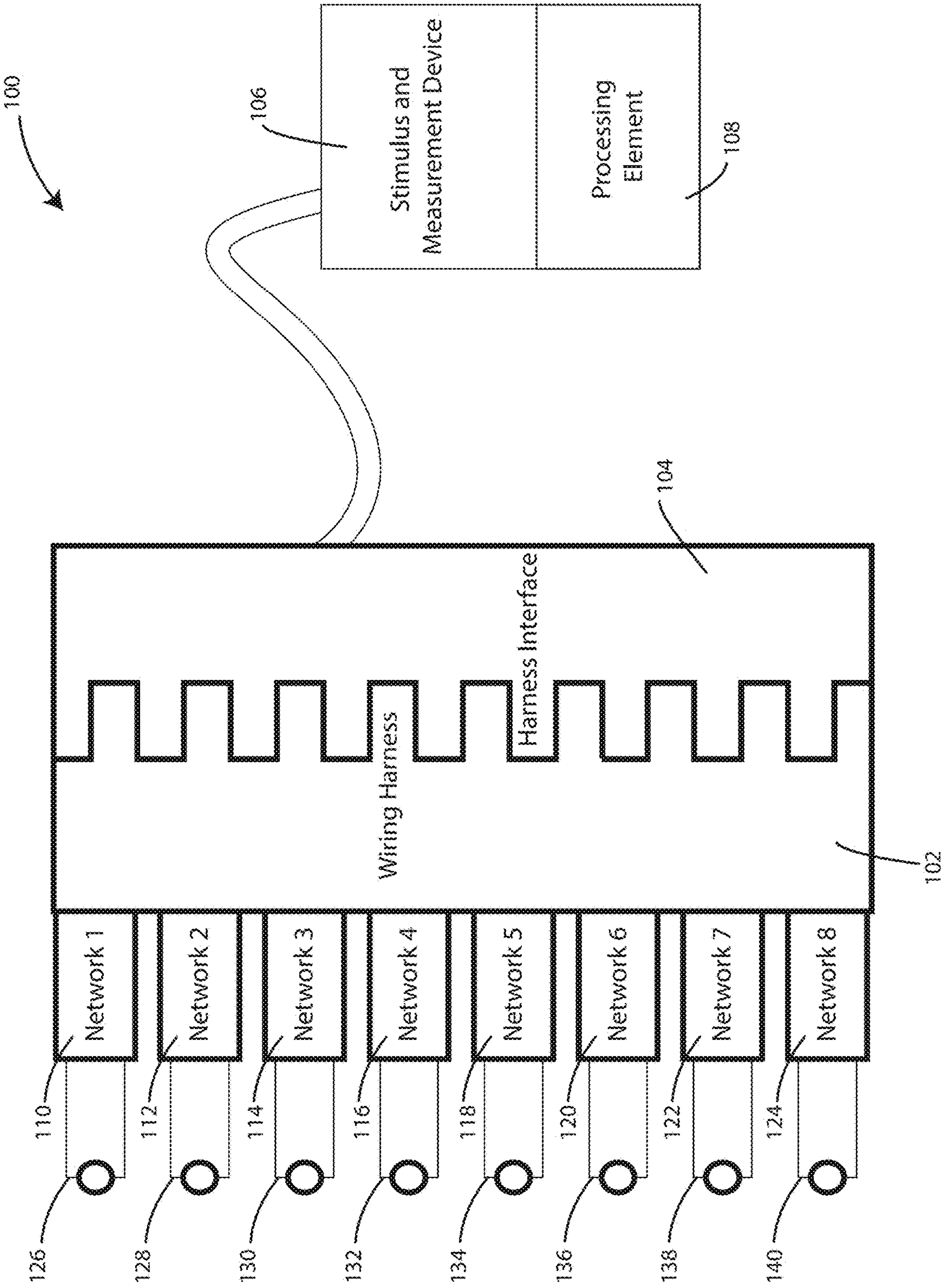
FIG. 1 is a schematic of a test system in accordance with various embodiments herein.

While embodiments are susceptible to various modifications and alternative forms, specifics thereof have been shown by way of example and drawings, and will be described in detail. It should be understood, however, that the scope herein is not limited to the particular aspects described. On the contrary, the intention is to cover modifications, equivalents, and alternatives falling within the spirit and scope herein.

DETAILED DESCRIPTION

Methods and systems for rapidly performing tests to identify faults of electrical wire/harness assemblies are provided herein. Various embodiments provide methods and systems directed to insulation resistivity testing of large-scale wiring harnesses that can dramatically reduce the time required to validate the integrity of the wiring harness. The various methods and systems provided herein can also rapidly identify and report any fault conditions, such as if the insulation resistance of the electrical wire/harness does not meet required performance parameters. The methods and systems provided herein can allow for insulation resistance validation testing of electrical wire/harness assemblies that can be accomplished in a much quicker and more reliable manner.

In the manufacturing or installation of electrical wiring systems and harnesses, it can be necessary to verify the insulation resistance of the conductors. Devices that run automated test scripts can be provided to do so. Such automatic test equipment (ATE) can require a plurality of interface adapters to connect to all conductors to be tested simultaneously, such that a test script can run automatically with little or no operator intervention after the test has started.

The results of such tests can be shown as individual measurements of insulation resistances from one group of end points of a wire system (e.g., outputs) to another group of end points (e.g., inputs).

A wiring network can include a group of points or wires within a wiring harness which are electrically connected, such as forming an insulated circuit. The circuit is intended to be electrically isolated from the other circuits.

Due to the configuration of existing systems, previous methods require detailed knowledge of the point-to-point wiring schematic of the wiring harness and are only capable of testing limited wiring networks during each test scan, thus requiring one scan for every wiring network to test the complete system.

In some embodiments, a wire harness can include 1200 or more wiring networks. Assuming no errors, the test would need to run 1200 insulation resistance tests to completely test the system. In some embodiments, a wire harness can include at least 100 networks. In some embodiments, a wire harness can include at least 500 networks. In some embodiments, a wire harness can include 1500 or fewer networks.

Due to the nature of insulation testing, a single test can take up to 10 seconds to allow the electrical measurements to stabilize, creating an accurate measurement. If a fault is identified during an initial scan, an additional 25-50 test can be required to locate the fault, further lengthening the overall testing time. After correcting the fault, which can be a time-consuming process, the entire test sequence must be rerun to ensure proper performance.

ATE can consist of several subsystems required to properly test and validate construction of a wiring harness assembly. A processing subsystem provides the interface to the computer running a user defined test script, translates those script instructions into machine code, controls the other subsystems, analyzes test results and reports results back to the computer running the test script.

A switching subsystem, via the processing sub-system, controls which test points from the unit under test (UUT) will be connected to the two groups (e.g. output and input bus).

A stimulus subsystem is configured to generate a specific voltage and current profile, as controlled by the processing subsystem, and send the specific voltage and current profile out through one of the two groups of points/networks (e.g. output bus).

A measurement subsystem can be connected to the other group of points/networks (e.g., input bus) and monitors the voltage and current returning from the UUT and determines the result of the test.

The processing subsystem reports the results back to a computer running the test script and can await further commands from that computer.

Conventional switching subsystems are designed such that isolating individual wiring networks is impossible, thereby rendering wiring network testing impossible. This limitation does not impact continuity or open circuit testing of wiring networks but creates a limitation for insulation resistance testing.

Insulation resistance testing verifies the integrity of the wiring insulation materials and the proper separation of wiring networks during the harness manufacturing process. Since conventional ATE system cannot connect to individual wiring networks, insulation testing is done by testing a single connection on a wiring network against other points on other wiring networks based upon how the UUT is connected to the test system.

The systems and methods described herein can include single pole single throw relays, as opposed to double pole double throw relays, to be able to connect to individual wiring networks. Alternative embodiments can include double pole double throw relays. However, in some embodiments that include double pole double throw relays, half of the relay can be wasted or not used. The systems and methods described herein can test networks in groups. Ultimately, the systems and methods provided herein test each network against every other network. The networks are tested in groups, such that multiple networks can be tested simultaneously to reduce the amount of total testing time. In order for a network to be tested against a different network, the two networks need to be split between the two groups (e.g., input group and output group) for a iteration of the process including sending out a specific voltage and measuring the returning voltage and current.

Referring now to FIG. 1, a schematic view of a testing system 100 is shown in accordance with various embodiments herein. The testing system 100 can include a harness interface 104 for contacting an electrical wiring harness 102 that is being tested. The harness interface 104 can be configured to contact two or more pins of the electrical wiring harness 102, such as to create electrical communication. The electrical wiring harness 102 can include a plurality of contacts. The contacts within the electrical wiring harness 102 can be in electrical communication with a circuit and/or one or more other contacts. Each of these circuits including the contacts within the electrical wiring harness 102 can be referred to as a network.

FIG. 1 shows a plurality of networks 110, 112, 114, 116, 118, 120, 122, 124. The networks are shown consecutively. However, it should be understood that the networks can be arranged in various manners relative to each other. Contacts within the wiring harness 102 that are part of a common network do not need to be adjacent to each other. As an example, contacts 1, 2, and 7 can be part of a first network, contacts 3, 6, and 8 can be part of a second network, and contacts 4 and 5 can be part of a third network. Each of the networks 110, 112, 114, 116, 118, 120, 122, 124 can include an external circuit 126, 128, 130, 132, 134, 136, 138, 140. In various embodiments, the external circuits 126, 128, 130, 132, 134, 136, 138, 140 can be a circuit included in an aerospace application. In some embodiments, the aerospace application can include an airplane, a helicopter, or a missile.

The testing system 100 can include a stimulus and measurement device 106. The stimulus and measurement device 106 can be further configured to measure electrical characteristics of the electrical wiring harness assembly 102. The stimulus and measurement device 106 is electrically connected to the harness interface 104. The stimulus and measurement device 106 can be configured to create a signal (e.g., output signal) for one or more networks being tested. The stimulus and measurement device 106 can be configured to read or measure a return signal (e.g., input signal).

The testing system 100 can include a processing element 108. The processing element 108 can be electrically connected to and in electrical communication with the harness interface 104 and/or the stimulus and measurement device 106. The processing element 108 can be configured to control the stimulus and measurement device 106.

The processing element 108 can be configured to execute a test, such as an insulation test, in an efficient manner. In various embodiments, as a result of the system 100 operating in an efficient manner, the amount of energy to accurately test all of the networks can be drastically reduced. The amount of time that computing systems can be running can be reduced. The processing element 108 can be configured in a manner that reduces the required processing power to execute the testing sequences. The configuration of the processing element 108 can The processing element 108 can be configured to execute the insulation test by iteratively dividing the plurality of networks into two separate groups (e.g. inputs and outputs), initiating an electrical signal to one of the two groups of networks, measuring a return electrical signal at the other groups of networks, comparing the measured electrical signal at the other group of networks with an expected electrical signal to determine a difference. If the difference between the measured electrical signal and an expected electrical signal is outside of a threshold range, the processing element 108 can determine error exists between at least one network in the electrical signal initiating group and the other group. The processing element 108 iteratively runs additional tests with removing portions of each group to isolate the precise networks that are causing the error.

In many embodiments, the processing element 108 can initially divide the groups into two groups that have the same number of networks. However, when there is an odd number of total networks, the two groups can differ in size by one network, while still being considered to be divided or separated in half.

Figure 2:
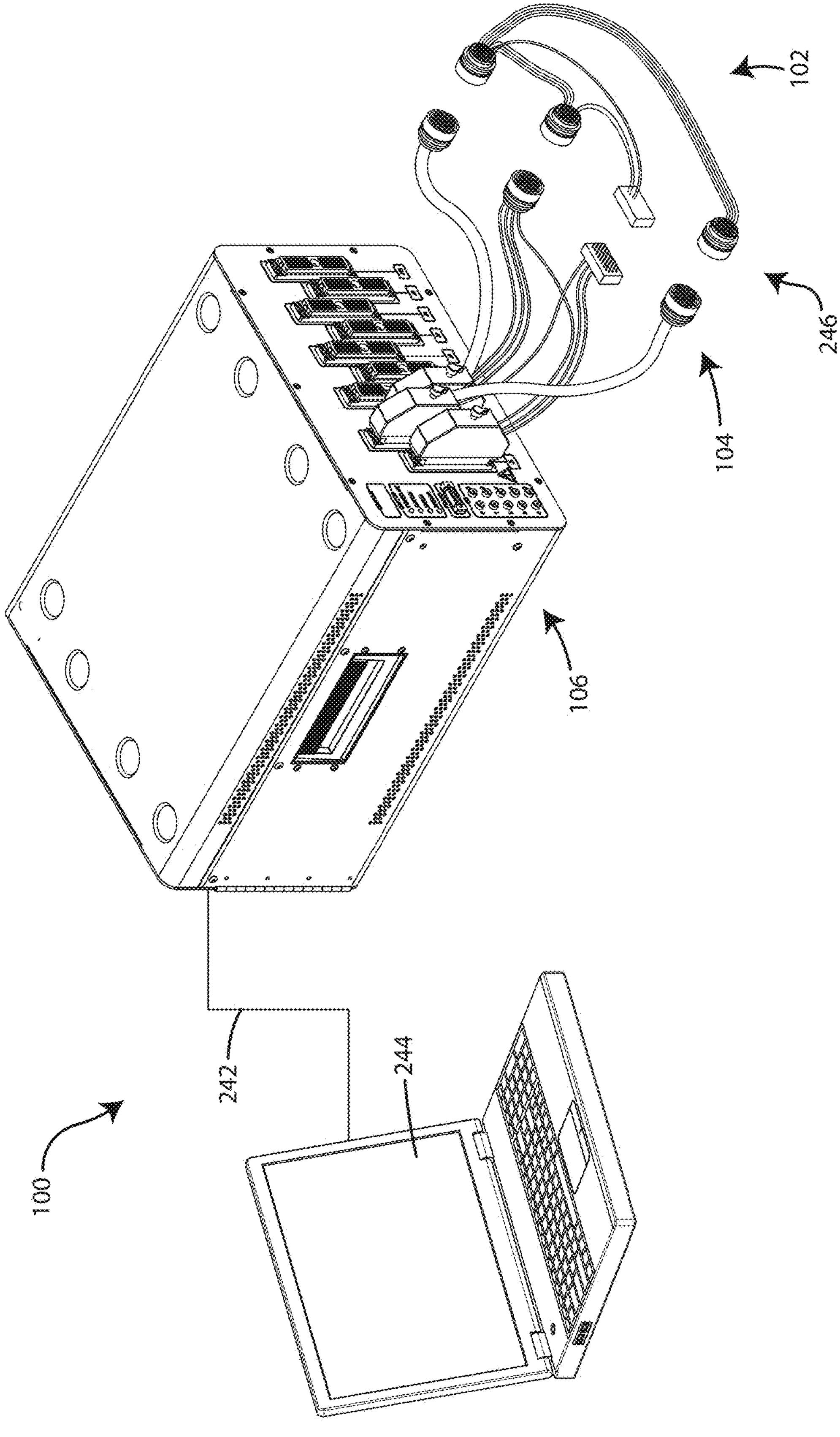
FIG. 2 is a perspective view of a testing system in accordance with various embodiments herein.
Figure 3:
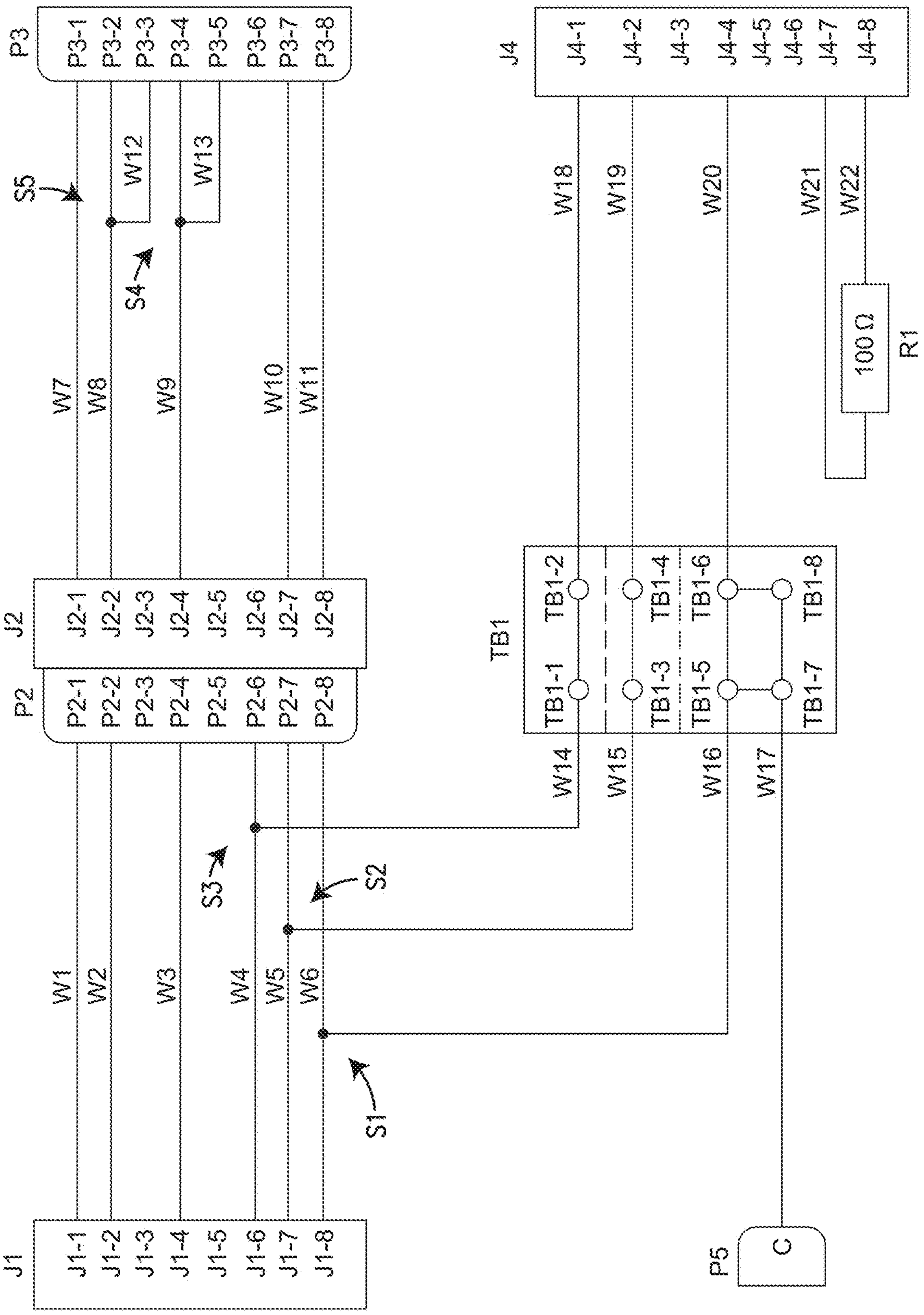
FIG. 3 is a schematic diagram of the unit under test in FIG. 2 in accordance with various embodiments herein.
Figure 4:
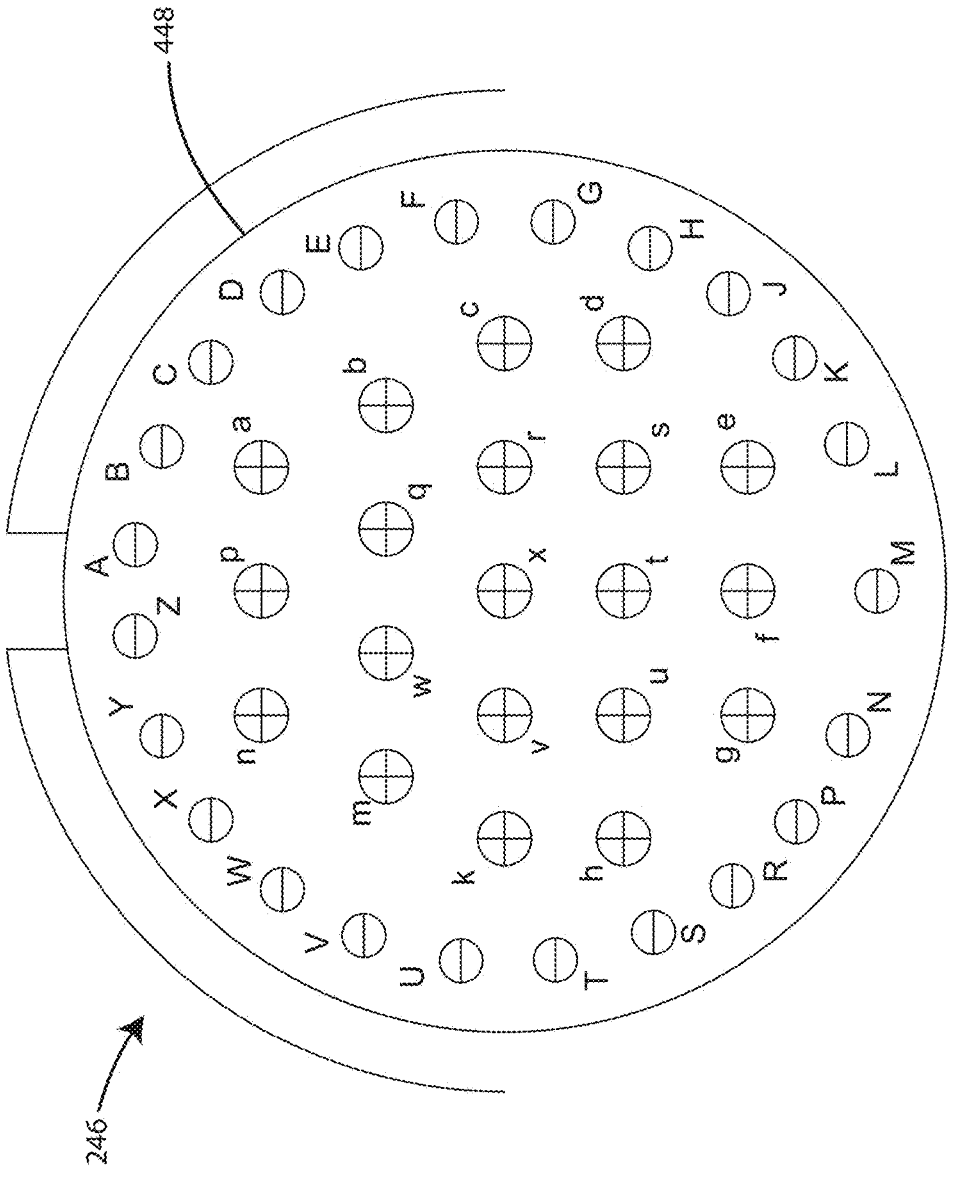
FIG. 4 is a schematic diagram of a topology of a contract arrangement of the unit under test of FIG. 2 in accordance with various embodiments herein.

In reference now to FIG. 2, the testing system 100 according to various embodiments is shown. As previously mentioned, the system 100 may be provided for testing and analyzing an electrical wiring harness assembly 102. The electrical wiring harness assembly 102 may include one or more cables, connectors, switches, relays, resistors, diodes, or the like with one or more nodes, such as multi-node wire harnesses. A schematic of an example electrical wiring harness assembly 102 is depicted in FIG. 3. The electrical wiring harness assembly 102 can include connectors J1, J2, J4, P2, P3, P5, terminal block TB1, wires W1, W2, W3, W4, W5, W6, W7, W8, W9, W10, W11, W12, W13, W14, W15, W16, W17, W18, W19, W20, W21, W22, resistor R1, and splices S1, S2, S3, S4, S5 as shown in FIG. 3. The connectors J1, J2, J4, P2, P3 can each include a number of contacts: connector J1 includes contacts J1-1, J1-2, J1-3, J1-4, J1-5, J1-6, J1-7, and J1-8; connector P2 includes contacts P2-1 through P2-8; connector J2 includes contacts J2-1 through J2-8; etc. Connector P5 may include a “coax” connector, with a single center contact “C” and a shield connected to ground (not depicted). Terminal block TB1 can include a number of contacts TB1-1, TB1-2 . . . , TB1-8, and a number of internal interconnections TB1-1-2, TB1-3-4, TB1-5-6, TB1-5-7, TB1-6-8, TB1-7-8. The electrical wiring harness assembly 102 can include a harness or mating connector 246 for connecting to equipment. An exemplary contact arrangement 448 for the harness is depicted in FIG. 3 with contacts A, B, C, D, E, F, G, H, J, K, L, M, N, P, R, S, T, U, V, W, X, Y, Z, a, b, c, d, e, f, g, h, k, m, n, p, q, r, s, t, u, v, w, x.

Figure 5:
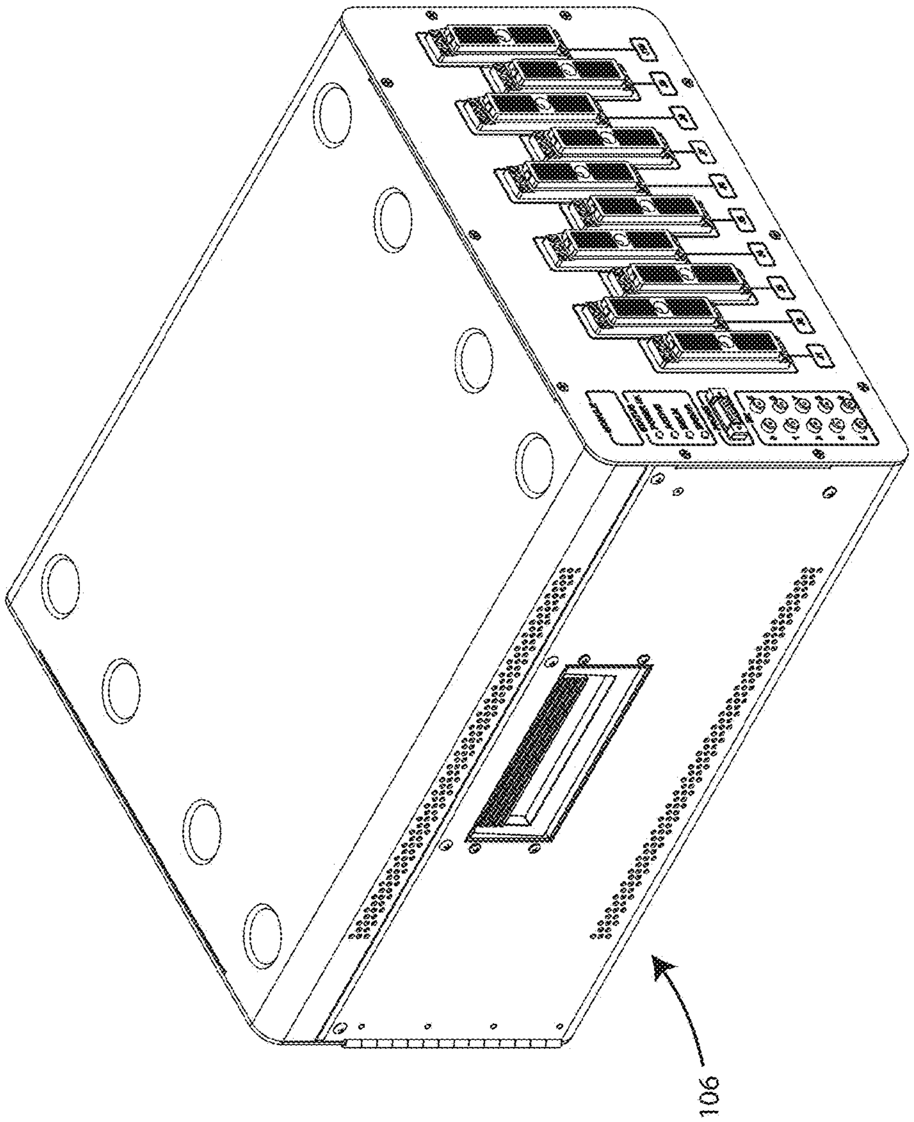
FIG. 5 is a perspective view of a stimulus and measurement device of the test system of FIG. 2 in accordance with various embodiments herein.
Figure 6:
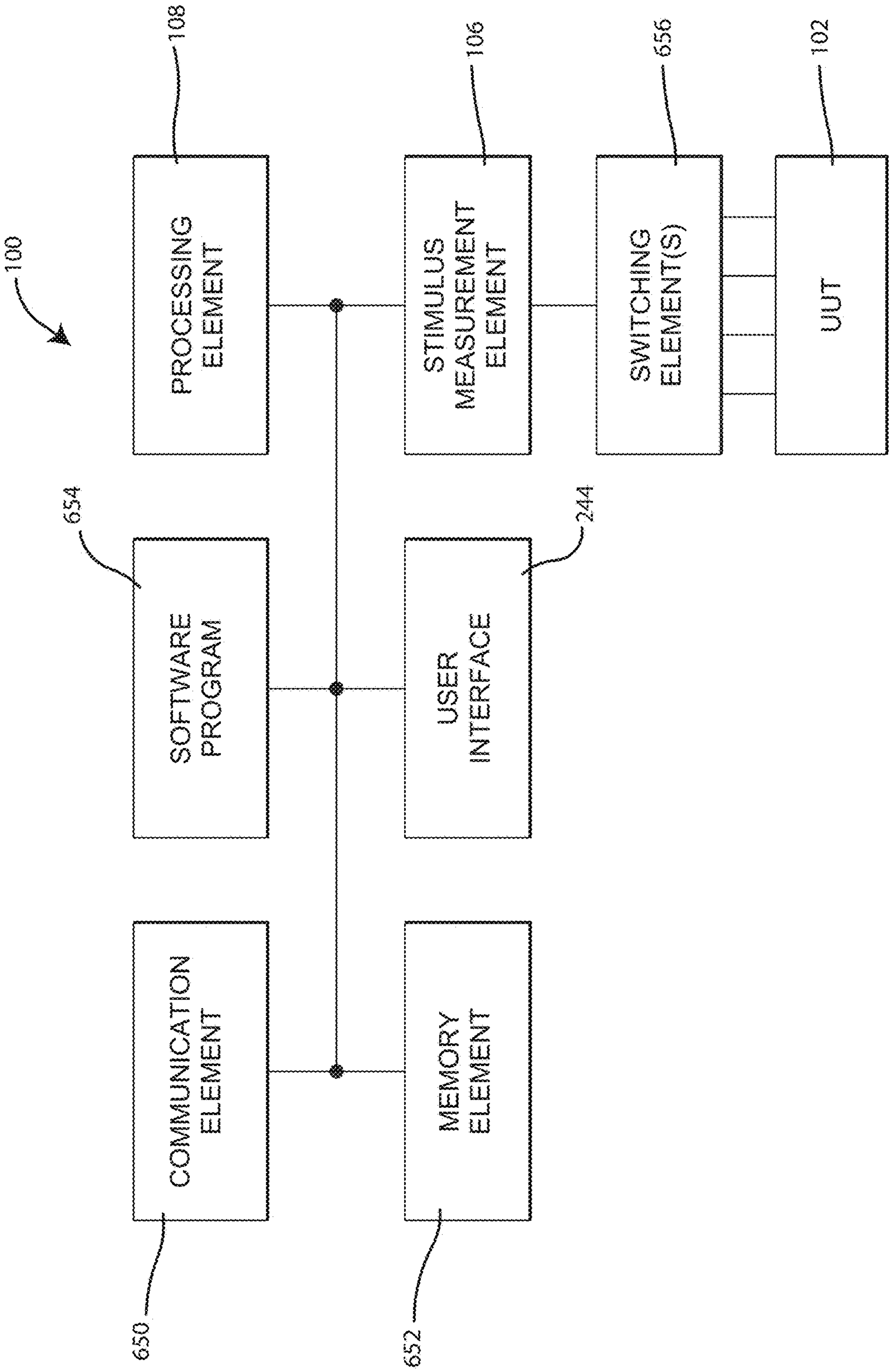
FIG. 6 is a schematic diagram depicting select components of the test system of FIG. 2 in accordance with various embodiments herein.

Turning to FIGS. 5 and 6, the system 100 broadly comprises a harness interface 104, a stimulus and measurement device 106, a switching element 656 (shown in FIG. 6), a user interface 244, a communication element 650, a memory element 652, a software program 654, and a processing element 108. The harness interface 104 is configured to connect to the mating connector 246 of the electrical wiring harness assembly 102.

The stimulus and measurement device 106 is configured to generate a signal for performing tests on the electrical wiring harness assembly 102. The stimulus and measurement device 106 may be configured to generate a voltage, current, waveform, or the like, and measure various electrical properties of the electrical wiring harness assembly 102 in response to the stimuli. The switching element 656 is configured to connect the stimulus and measurement device 106 to the harness interface 104. The switching element 656 may comprise a switching matrix, such as a switch module, or pluralities thereof. In some embodiments, the switching element 656 may be integrated into the stimulus and measurement device 106. In some embodiments, the switching element 656 may comprise a switch module connected to the stimulus and measurement device 106.

The user interface 244 generally allows the user to utilize inputs and outputs to interact with the system 100. The user interface 244 may be in communication with the stimulus and measurement device 106 via a wired and/or wireless connection, as schematically represented by line 242 in FIG. 2. The wired or wireless connection 242 may comprise an ethernet cable, a USB cable, a Wi-Fi connection, a Bluetooth™ connection, or any of the communication techniques described below in connection with the communication element 650. Inputs may include buttons, pushbuttons, knobs, jog dials, shuttle dials, directional pads, multidirectional buttons, switches, keypads, keyboards, mice, joysticks, microphones, touch screens, mouse pads, or the like, or combinations thereof. Outputs may include audio speakers, lights, dials, meters, printers, screens, displays, or the like, or combinations thereof. With the user interface 244, the user may be able to control the features and operation of what is displayed. While FIGS. 1 and 2 depict the testing system 100 as comprising various components integrated in separate housings, the components of the testing system 100 may be integrated and/or connected in any number of ways without departing from the scope of the present invention. For example, in some embodiments, all the components of the system 100 may be integrated into a single device with a single housing.

The communication element 650 generally allows communication between the system 100 and other testing systems, external devices, laptops, computers, or the like. The communication element 650 may include signal or data transmitting and receiving circuits, such as antennas, amplifiers, filters, mixers, oscillators, digital signal processors (DSPs), and the like. The communication element 650 may establish communication wirelessly by utilizing radio frequency (RF) signals and/or data that comply with communication standards such as cellular 2G, 3G, 4G or 5G, Institute of Electrical and Electronics Engineers (IEEE) 802.11 standard such as WiFi, IEEE 802.16 standard such as WiMAX, Bluetooth™, or combinations thereof. In addition, the communication element 650 may utilize communication standards such as ANT, ANT+, Bluetooth™ low energy (BLE), the industrial, scientific, and medical (ISM) band at 2.4 gigahertz (GHz), or the like. Alternatively, or in addition, the communication element 650 may establish communication through connectors or couplers that receive metal conductor wires or cables, like Cat 6 or coax cable, which are compatible with networking technologies such as ethernet. In certain embodiments, the communication element 650 may also couple with optical fiber cables. The communication element 650 may be in communication with the user interface 244, the memory element 652, and/or the processing element 108.

The memory element 652 may include electronic hardware data storage components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 652 may be embedded in, or packaged in the same package as, the processing element 108. The memory element 652 may include, or may constitute, a "computer-readable medium." The memory element 652 may store the instructions, code, code segments, software, firmware, programs, applications, apps, services, daemons, or the like that are executed by the processing element 108. In an embodiment, the memory element 652 stores the software application/program 654. The memory element 652 may also store settings, data, documents, sound files, photographs, movies, images, databases, and the like.

The processing element 108 may include electronic hardware components such as processors. The processing element 108 may include microprocessors (single-core and multi-core), microcontrollers, digital signal processors (DSPs), field-programmable gate arrays (FPGAs), analog and/or digital application-specific integrated circuits (ASICs), or the like, or combinations thereof. The processing element 108 may generally execute, process, or run instructions, code, code segments, software, firmware, programs, applications, apps, processes, services, daemons, or the like. For instance, the processing element 108 may execute the software application/program 654. The processing element 108 may also include hardware components such as finite-state machines, sequential and combinational logic, and other electronic circuits that can perform the functions necessary for the operation of the current invention. The processing element 108 may be in communication with the other electronic components through serial or parallel links that include universal busses, address busses, data busses, control lines, and the like.

The processing element 108 is configured to perform one or more tests on the electrical wiring harness assembly 102 via the switching element 656 and the harness interface 104, analyze the results, and output the results in various forms, such as in natural language via the user interface 244 or recording of results in a log in the memory element 652. For example, the processing element 108 may be configured to determine prospective insulation leakage errors between networks that should be isolated from each other in the electrical wiring harness assembly 102. For each error, the processing element 108 may be configured to access a database of wiring diagrams and display a wiring diagram for one or more networks that have been determined have an error associated with them. The processing element 108 may be configured to report probable error type in natural language via the user interface 244. The reporting may comprise displaying the natural language on a display of the user interface 244, printing the natural language via a paper printer of the user interface 244, outputting the natural language to a data file, or the like. In response to determining an error exists, a user can be notified of the error and then fix the error.

Figure 7:
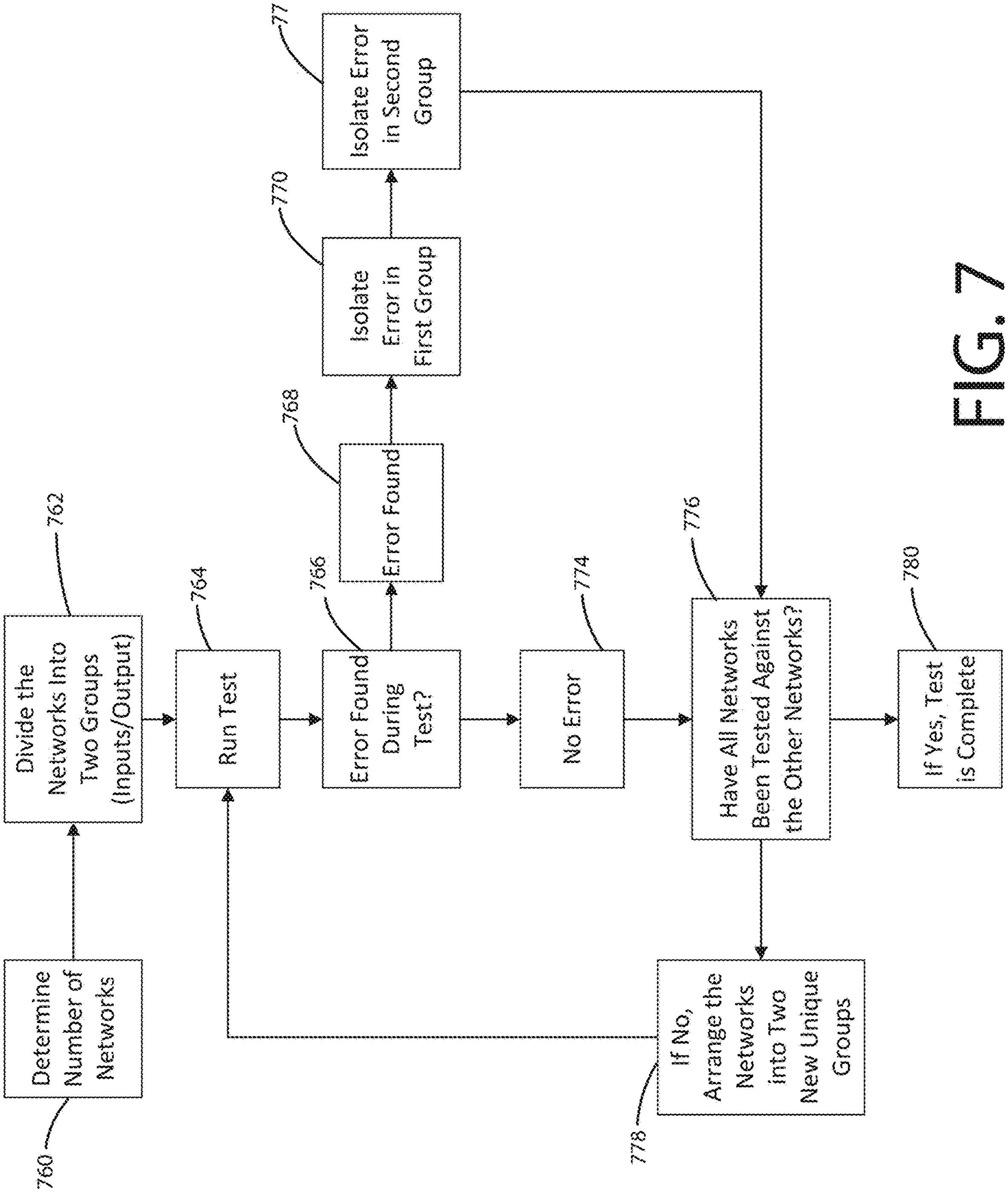
FIG. 7 is a flowchart illustrating a portion of a testing method in accordance with various embodiments herein.

In reference now to FIG. 7, a flowchart illustrating portions of a testing process in accordance with various embodiments herein. The process depicted in FIG. 7 can be implemented by the testing system 100.

In an initial step of various embodiments, a total number of networks to be tested must be determined or established 760. In some embodiments, the system 100 can receive the total number of networks and the associated orientation of the contacts within the unit under test as input.

Once the number of networks is determined or established, the system 100 can proceed to divide the networks into two groups 762 for running a test. In various embodiments, the networks are divided into two equal sized groups. However, in the case of an odd number of total networks, one of the two groups can include one more network than the other group. In various embodiments, one of the groups is designated as the outputs and the other groups is designated as the inputs.

After the two groups are established, a test can be run 764. A test can involve the stimulus and measurement device 106 generating a specific voltage and current profile, as controlled by the processing subsystem, and sending the specific voltage and current profile out through one of the two groups of networks (e.g., the output group). The test can further include the stimulus and measurement device 106 monitoring the voltage and current returning from the UUT at the other group of networks (e.g., the input group).

A measurement subsystem can be connected to the other group of points/networks (e.g., input bus) and monitors the voltage and current returning from the UUT and determines the result of the test.

A run of a test can further include determining if an error exists 766 between at least one network in the first group and at least one network in the second group. A test can determine if the monitored voltage and current at the second group of networks (e.g., the input group) is within an expected threshold. By sending out a known signal through the first group of networks, through known circuits, an expected return signal can be known, determined, or established. The expected return signal can be compared to the actual signal. If the difference between the two signals is outside of a threshold range, it can be determined that a problem exists between at least one of the networks in the first group and one of the networks in the second to the second group of networks. In various embodiments, if the return signal is below an expected threshold it can indicate that there is too much resistance and a portion of the circuit might be configured incorrectly. In various embodiments, if the return signal is above an expect threshold it can indicate that there is not enough resistance and a portions of the circuit might be configured incorrectly, such as if there is a short in the circuit or leakage from an adjacent circuit. In various embodiments, the threshold value or threshold range can vary depending on which network or networks are/is being tested. In some embodiments, each iteration of the test can include updating the threshold difference to account for which networks are being tested.

If an error is found 768, the system 100 can proceed to determine precisely what networks combination of networks is causing the error. The system can isolate the error in the first group 770 and isolate the error in the second group 772. The steps for isolating the errors in the two groups are described in FIG. 8. Further, it should be understood that the network in the second group can be isolated prior to isolating the network in the first group. The order of which group's network is isolated first can be irrelevant in many embodiments as long as both networks are identified.

Once it has been determined that a network or a combination of networks is problematic (i.e., causing an error), it can be removed from subsequent iterations of the testing, since it is already known that problematic network(s) will need to be serviced and continuing to include the problematic network(s) in subsequent tests can result in finding the error that are already known.

If no error is found 774 or, if an error exists, the problematic networks have been identified 770, 772, the system 100 can determine if additional test are needed 776. Additional tests are needed until each network has been tested against every other network.

A network is tested against another network when the two networks are in separate groups. As an example, if there are four total networks, the first and second networks can be tested against the third and fourth networks in a first test, and a second test can evaluate the first and third networks against the second and fourth networks. In this example, only two tests are needed for each of the networks to be tested against each other.

If all of the networks have not yet been tested against all other networks, the process can be repeated with a new division of the plurality of networks into two new unique groups 778. In various embodiments, half of the first group from the previous iteration of the test is replaced with half of the second group from the previous iteration of the test. Likewise, half of the second group is replaced with half of the first group from the previous iteration of the test.

Once all of the networks have been tested against all of the other networks and all of the errors have been found, the test can be completed 780.

Figure 8:
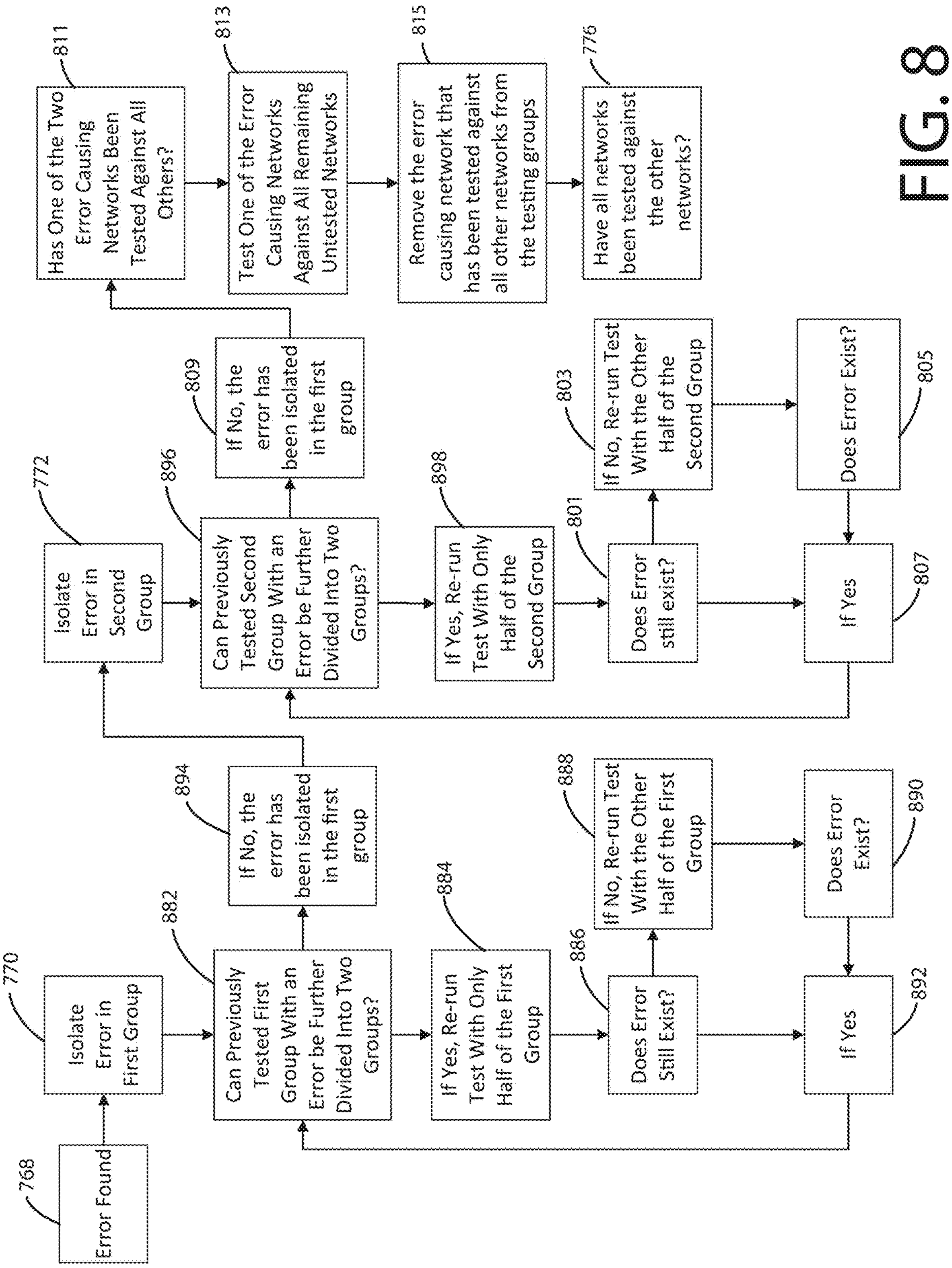
FIG. 8 is a flowchart illustrating a portion of a testing method in accordance with various embodiments herein.

FIG. 8 shows a flowchart illustrating the isolation or identification of error causing networks in accordance with various embodiments herein.

As mentioned above, an error can be found in a test 768. Upon determining that an error exists in an iteration of a test, if the error causing tests include more than one networks in at least one of the two groups, additional test can be run to isolate and identify the error causing networks. The error causing network can be isolated and therefore identified for the first group 770 and for the second group 772.

Upon determining that an error exists, it can be determined if the first group in the most recent iteration of the test (test that resulted in the error) includes more than one network 882. If the first group does not include more than one network, the error causing network has been isolated 894 and the process can proceed to isolate the error in the second group 772.

If the first group in the most recent iteration of the test (test that resulted in the error) includes more than one network, the first group can be reduced in half and an additional test can be run against the entire second group of the test that resulted in the error 884.

The system can then determine if an error exists in the additional test 886. If the error does exist 892, the process can return to step 882 with a first group that is half of the number of networks (+/−one network to account for odd numbers of networks) as the previous iteration of step 882.

If the additional test does not result in an error, in some embodiments, a test can be run using the other half of the first group 888. The system can then determine if an error exists in the combination of the other half of the first group with the second group 890. This combination should result in an error 892. In some embodiments, steps 888 and 890 can be skipped, and the system can proceed to step 882 with the other half of the first group 888 (error causing half that was removed from the process in the most recent iteration of step 884).

If the first group does not include more than one network, the error causing network has been isolated 894 and the process can proceed to isolate the error in the second group 772.

The system 100 can determine if the second group in the most recent iteration of the test (test that resulted in the error) includes more than one network 896. If the second group does not include more than one network, the error causing network has been isolated 809 and the process can proceed to step 811.

If the second group in the most recent iteration of the test (test that resulted in the error) includes more than one network 898, the second group can be reduced in half and an additional test can be run against a first group that only includes the identified error causing network.

The system can then determine if an error exists in the additional test 801. If the error does exist 807, the process can return to step 896 with a second group that is half of the number of networks (+/−one network to account for odd numbers of networks) as the previous iteration of step 896.

If the additional test does not result in an error, in some embodiments, a test can be run using the other half of the second group 803. The system can then determine if an error exists in the combination of the other half of the second group with the isolated network in the first group 805. This combination should result in an error 807. In some embodiments, steps 803 and 805 can be skipped, and the system can proceed to step 896 with the other half of the second group 803 (error causing half that was removed from the process in the most recent iteration of step 898).

After the two (or more) networks causing an error have been identified, the system 100 can determine is if at least one of the two (or more) error causing networks has been tested against all of the other networks 811. If not, the system can test one of the error causing networks against all of the remaining networks that is has not yet been tested against 813. Once one of the networks has been tested against all of the other networks, the system 100 can remove the network from the networks being tested in subsequent tests 815.

In various embodiments, once the error causing networks have been identified, additional tests can be run without including at least one of the problematic networks. The process can then proceed to step 776 shown in FIG. 7.

Figure 9:
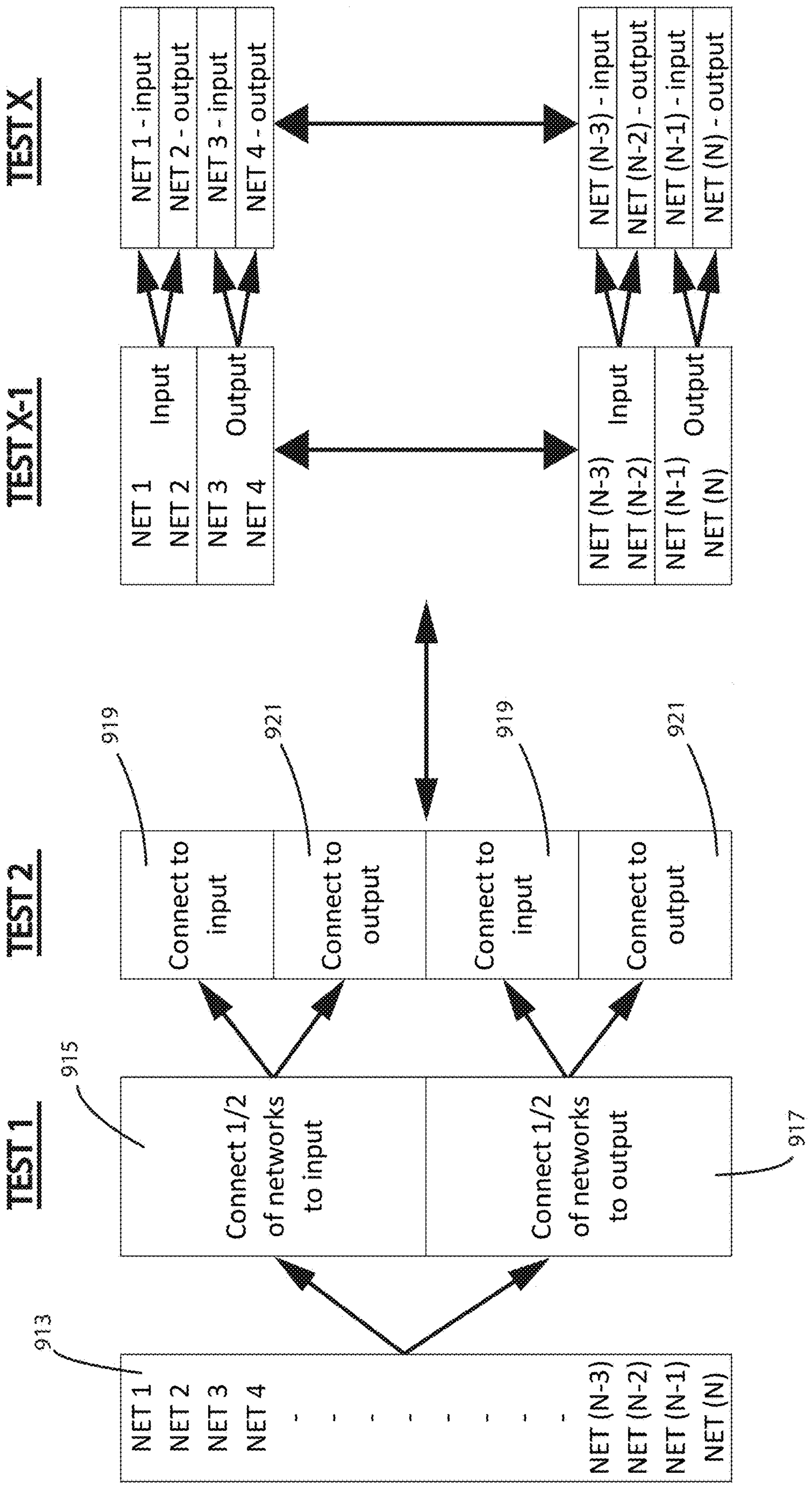
FIG. 9 is a schematic of a testing process for various numbers of networks in accordance with various embodiments herein.

FIG. 9 is a schematic of the changing of groups in accordance with various embodiments herein. FIG. 9 shows an example of how the first group and second group can be redistributed between subsequent runs of the test, such as to test each network against every other network in a time efficient manner.

As discussed above, a total pool of networks 913 is initially established. In the example of FIG. 9, there are "n" networks included in the pool. The first test includes a first group of networks 915 and a second group of networks 917. If no error exists or once the error from the first test has been identified, a subsequent test can be run with different first and second groups. In some embodiments, a subsequent test can have a first group that includes half of the previous first group and half of the previous second group.

As shown in FIG. 9, a second test can be run with a different combination of networks in the first group 919 and a different combination of networks in the second group 921 compared to the groups 915, 917 in the first test. The first group 919 can include half of the networks that were previously included in the first group 915. Similarly, the second group 921 can include half of the networks that were previously included in the second group 917. This method of rearranging networks within the first group and the second group can be reiterated until all networks have been tested against all other networks.

FIGS. 10-17 show various examples of the steps taken to find combinations of networks that result in errors or failures for the insulation testing. The examples in FIGS. 10-17 show an initial pool of eight networks being tested. However, it should be understood that the principles and patterns shown can be expanded for any number of networks. The examples in FIGS. 10-17 are shown to isolate an error causing network in the first group prior to isolating an error causing network in the second group. It should be understood that the order of identifying error causing networks in the first group and the second group can be switched, such that the second group is evaluated prior to the first group. The system can evaluate the groups in the same manner regardless of the order.

Example 1

FIG. 10 shows a schematic of a testing routine in accordance with various embodiments herein. The networks in the example of FIG. 10 result in no errors or failures of the test being conducted.

In the first step, half of the networks (networks 1-4) are tested against the other half of the networks (networks 5-8). This results in a pass. Therefore, it can be established that there is no error between network 1 and any of the networks 5-8. Similarly, it has been established that no errors exist between networks 2-4 and any of the networks 5-8.

In a second step, half of the original first group (networks 1-2) and half of the original second group (networks 5-6) are established as the new first group and are tested against a new second group (networks 3-4 and 7-8). This also results in a pass.

In a final step, a third first group includes networks 1, 3, 5, and 7 is tested against a third second group that includes networks 2, 4, 6, and 8, which also results in a pass. In the example of FIG. 10 only three iterations of step 766 are needed to test each of the networks against all of the other networks. No additional tests were required to isolate problematic networks, because all tests resulted in a pass.

Example 2

FIG. 11 shows a schematic of a testing routine in accordance with various embodiments herein. In the first step, half of the networks (networks 1-4) are tested against the other half of the networks (networks 5-8). This results in a failure. Therefore, it must be established which combination of a network from the first group and a network from the second group causes the failure.

A second step uses a first group including networks 1 and 2 (half of the previous first group) against a second group that includes networks 5-8 (the previous second group). The second step results in a pass. In this case step 888 is skipped, and the isolation process proceeds to step 882 testing half of the remaining half of the first group (network 3) against the second group (networks 5-8) in a third step. This results in a pass.

At this point, it is known that network 4 causes an error with one of networks 5-8. A confirmation step 888 is conducted in a fourth step, testing network 4 against networks 5-8, which results in a failure. At this point, the process moves to step 772 to isolate the problematic network in the second group.

In the fifth step, half of the second group is tested against the reduced first group including only network 4. This results in a pass.

In a sixth step, half of the remaining portion of the second group is tested against the first group including only network 4.

In a seventh step, a confirmation step 803 is conducted. In the seventh step, network 4 is the only network in the first group and network 8 is the only network in the second group. The failure in step 1 has been established as a failure between networks 4 and 8.

The process can then include testing network 4 against networks 1-3, in the eighth step to ensure network 4 has been tested against all other networks. Network 4 can be removed from consideration in subsequent tests, since it has already been tested against all other networks.

The ninth step is the same as first step, but with network 4 removed from the first group. The ninth step results in a pass. The tenth step and eleventh steps include the remaining combinations of networks that need to be tested against each other.

Example 3

FIG. 12 shows a schematic of a testing routine in accordance with various embodiments herein. In the first step, half of the networks (networks 1-4) are tested against the other half of the networks (networks 5-8). This results in a failure. Therefore, it must be established which combination of a network from the first group and a network from the second group causes the failure.

A second step uses a first group including networks 1 and 2 (half of the previous first group) against a second group that includes networks 5-8 (the previous second group). The second step results in a failure.

In a third step, half (network 1) of the previous first group (networks 1 and 2) is tested against the second group. This results in a failure. Therefore, network 1 has been isolated as the problematic network in the first group from the first step.

Steps 4-6 isolate the problematic network from the second group in the first step, which is determined to be network 8 in step 6. The seventh step tests network 1 as the first group against networks 2-4 as the second group prior to network 1 being removed from the testing process, since it is known to be problematic.

The eighth step is the same as first step, but with network 1 removed from the first group. The eighth step results in a pass. The ninth step and tenth steps include the remaining combinations of networks that need to be tested against each other.

Example 4

FIG. 13 shows a schematic of a testing routine in accordance with various embodiments herein. In the first step, half of the networks (networks 1-4) are tested against the other half of the networks (networks 5-8). This results in a pass.

In a second step, half of the original first group (networks 1-2) and half of the original second group (networks 5-6) are established as the new first group and are tested against a new second group (networks 3-4 and 7-8). This results in a failure.

A third step uses a first group including networks 1 and 2 (half of the previous first group) against a second group that includes networks 3-4 and 7-8 (the previous second group). The third step results in a failure.

In a fourth step, half (network 1) of the previous first group (networks 1 and 2) is tested against the second group. This results in a pass.

In a fifth step, network 2 is tested against the second group (networks 3-4 and 7-8) in a step equivalent to step 888 in FIG. 8. At this point network 2 is isolated as the problematic network in the first group from the second step.

Steps 6-8 isolate the problematic network from the second group in the second step, which is determined to be network 4 in step 8. The ninth step tests network 2 as the first group against network 1 as the first group prior to network 2 being removed from the testing process, since it is known to be problematic.

The tenth step is the same as second step, but with network 2 removed from the first group. The tenth step results in a pass. The eleventh step includes the remaining combinations of networks that need to be tested against each other.

Example 5

FIG. 14 shows a schematic of a testing routine in accordance with various embodiments herein. In the first step, half of the networks (networks 1-4) are tested against the other half of the networks (networks 5-8). This results in a pass.

In a second step, half of the original first group (networks 1-2) and half of the original second group (networks 5-6) are established as the new first group and are tested against a new second group (networks 3-4 and 7-8). This step results in a failure.

A third step uses a first group including networks 1 and 2 (half of the previous first group) against a second group that includes networks 3-4 and 7-8 (the previous second group). The third step results in a pass.

In a fourth step, half of the remaining portion of the first group from step 2 (network 5) is tested against the second group (networks 3-4 and 7-8). This results in a failure.

In a fifth step, network 5 is tested against half of the second group (networks 3-4) from step 2. The fifth step results in a pass.

In a sixth step, network 5 is tested against half of the remaining portion (untested portion of the second group from step 5). As such, network 5 is tested against network 7, which results in a pass.

In a seventh step, network 5 is tested against the last remaining network in the second group from step 4, which results in a test of network 5 against network 8. The seventh step results in a failure as expected.

Step 8 involves testing a problematic network (network 5) against all the networks that network 5 has not yet been tested against, which in this case is only network 6.

In the ninth step, the second step is repeated with network 5 removed from the test. The tenth step includes the remaining combinations of networks that need to be tested against each other.

Example 6

FIG. 15 shows a schematic of a testing routine in accordance with various embodiments herein. In the first step, half of the networks (networks 1-4) are tested against the other half of the networks (networks 5-8). This results in a pass.

In a second step, half of the original first group (networks 1-2) and half of the original second group (networks 5-6) are established as the new first group and are tested against a new second group (networks 3-4 and 7-8). This also results in a pass.

In a third step, the remaining combinations of networks that need to be tested against each other are tested. This results in a failure. Steps 4-7 isolate the problematic combination of networks 1 and 2. The eighth step repeats the third step with network 1 removed from the test.

Example 7

FIG. 16 shows a schematic of a testing routine in accordance with various embodiments herein. In the first step, half of the networks (networks 1-4) are tested against the other half of the networks (networks 5-8). This results in a failure. Therefore, it must be established which combination of a network from the first group and a network from the second group causes the failure.

A second step uses a first group including networks 1 and 2 (half of the previous first group) against a second group that includes networks 5-8 (the previous second group). The second step results in a failure.

In the third step, the previous first group from the second step (most recent failed test) is divided in half again. In the third step, the first group only includes network 1. The second group remains the same as the first two steps (networks 5-8).

Various embodiments can include the fourth step as a confirmation step 888. The fourth step compares the first group (network 2) to the second group (networks 5-8). Steps 2-4 isolate and identify a network in the initial first group from step 1 as an error causing network.

Steps 5-7 isolate the network from the initial second group from step 1 as an error causing network when tested against network 2. Specifically, the seventh step identifies that network 6 causes an error when tested against network 2.

In the eighth step, network 2 is tested against all of the other networks that network 2 has not yet been tested against with a passing result. In the eighth step, the first group (network 2) is tested against a second group that includes networks 1, 3, 4, 7, and 8. Network 2 previously passed a test against network 5 in step 6.

In the ninth step, the first step is repeated with network 2 removed from the first group. The ninth step results in a failure.

Steps 10-13 reduce the first group to identify the error causing network. In step 13, network 4 is identified as an error causing network. Step 13 is a confirmation step 888, which can be skipped in some embodiments.

Steps 14-16 reduce the second group to identify the error causing network. In step 16, network 8 is identified as an error causing network. Step 16 is a confirmation step 888, which can be skipped in some embodiments.

Step 17 test network 4 against the remaining networks it has not yet been tested against (networks 1 and 3), prior to removing network 4 from the testing process.

Step 18 is the same as step 1 with networks 2 and 4 removed from the first group. Steps 19 and 20 include the remaining combinations of networks that need to be tested against each other with networks 2 and 4 removed. Steps 19 and 20 both result in a pass.

Example 8

FIG. 17 shows a schematic of a testing routine in accordance with various embodiments herein. In the first step, half of the networks (networks 1-4) are tested against the other half of the networks (networks 5-8). This results in a failure. Therefore, it must be established which combination of a network from the first group and a network from the second group causes the failure.

A second step uses a first group including networks 1 and 2 (half of the previous first group) against a second group that includes networks 5-8 (the previous second group). The second step results in a failure.

In a third step, half (network 1) of the previous first group (networks 1 and 2) is tested against the second group. This results in a failure. Therefore, network 1 has been isolated as the problematic network in the first group from the first step.

Steps 4-6 isolate the problematic network from the second group in the first step, which is determined to be network 8 in step 6. The seventh step tests network 1 as the first group against networks 2-4 as the second group prior to network 1 being removed from the testing process, since it is known to be problematic.

The eighth step is the same as first step, but with network 1 removed from the first group. The eighth step results in another failure. Steps 9-13 isolated the second combination of networks that results in a failure. The combination of network 3 and network 8 results in a failure in this example, along with the combination of network 1 and network 8 resulting in a failure.

The fourteenth step, fifteenth step, and the sixteenth step include the remaining combinations of networks that need to be tested against each other with networks 1 and 3 removed. The fourteenth step, fifteenth step, and the sixteenth step all result in a pass.

Phantom Errors

In some instance, a phantom error can be detected by the system. A phantom error is an "error" that was detected in one stage of the testing, but when the system attempts to isolate the error, the error cannot be found. The error cannot be found, because on a individual (or small group) basis, the networks pass the test.

In some scenarios, the phantom error can be a result of a parallel resistance problem. The same signal can be output regardless of the number of networks being tested. As that signal is divided among additional networks, the resistance can be greatly reduced such that it appears to be a failure.

The error can also be a result of multiple individual networks being concentrated on the same (low) end of an individual tolerance range. When a single network is tested against another single network, the test can be considered a pass if the measured resistance falls within a tolerance range. If multiple networks are individually concentrated on one end of the tolerance range, when those multiple networks are tested together the resulting resistance can be outside of a passing tolerance range scaled for multiple circuits.

As an example, Network A has a resistance of 2.1 megaohms and an acceptable range of 2-5.5 megaohms. Networks B, C, D, E, F, and G also have a resistance of 2.1 megaohms. In theory, each network can have an average resistance of 4.5 megaohms;

however, in practice each of these networks is at 2.1 megaohms. As a result, when networks A-G are all tested together, since networks A-G are all on the low end the tolerance range, in congregate the networks A-G fall outside of an acceptable tolerance range resulting in a failure. However, there actually is not a single individual network that would result in a failure, because all of the networks individually fall within the acceptable range. All networks pass their individual tests.

The systems and methods can detect these phantom errors, and avoid recording or reporting them. The system will detect a potential error and run additional tests to determine if the error is real or not (isolate the error). These can be the same steps as isolating an error as discussed above.

When trying to isolate the "error" all the networks will come back as passing. The system can conclude that the "error" is not actually a problem and it can be classified as a phantom error or ignored by the system. In various embodiments, the phantom error will not be reported or recorded, because it is not truly an error. This can save time from fixing a non-existent problem.

FIGS. 18-19 show examples of an "error" being detected and determining that the "error" is a phantom error or not actually an error. As the system attempts to isolate the detected error, the system recognizes that each of the networks falls within an acceptable tolerance range, and no error actually exists.

Example 9

FIG. 18 shows a schematic of a testing routine in accordance with various embodiments herein. In the first step, half of the networks (networks 1-4) are tested against the other half of the networks (networks 5-8). This results in a failure. Therefore, the system must be established which combination of a network from the first group and a network from the second group causes the failure.

A second step uses a first group including networks 1 and 2 (half of the previous first group) against a second group that includes networks 5-8 (the previous second group). The second step results in a pass.

In a third step, half (network 3) of the remaining networks (networks 3 and 4) from the initial first group (networks 1, 2, 3, and 4) is tested against the second group. This results in a pass.

In a fourth step, the remaining network (network 4) is tested against the second group. This results in a pass as well. At this point, it can be concluded that the error detected in the first step is a phantom error. As such, the detected error in the first step does not need to be remedied (as no error actually exists) or the detected error can be ignored.

Example 10

FIG. 19 shows a schematic of a testing routine in accordance with various embodiments herein. In the first step, half of the networks (networks 1-4) are tested against the other half of the networks (networks 5-8). This results in a failure. Therefore, the system must be established which combination of a network from the first group and a network from the second group causes the failure.

A second step uses a first group including networks 1 and 2 (half of the previous first group) against a second group that includes networks 5-8 (the previous second group). The second step also results in a failure.

In a third step, a first group including network 1 is tested against the second group. This results in a pass.

In a fourth step, the remaining network (network 2) is tested against the second group. This results in a pass as well. At this point, it can be concluded that the error detected in the second step is a phantom error. As such, the detected error in the second step does not need to be remedied (as no error actually exists) or the detected error can be ignored.

Steps 5 and 6 attempt to isolate the error from the first step, since steps 3 and 4 have determined that networks 1 and 2 do not have a problem when individually tested against networks 5-8.

In a fifth step, a first group including network 3 is tested against the second group. This results in a pass.

In a sixth step, a first group including network 4 is tested against the second group. This results in a pass.

At this point, it can be concluded that the error detected in the first step is a phantom error. As such, the detected error in the first step does not need to be remedied (as no error actually exists) or the detected error can be ignored.

It should be understood that in some embodiments, the fifth step can include a first group with networks 3 and 4. If the first group consisting of networks 3 and 4 is tested against the second group (networks 5-8) and the test results in a pass, it can be determined that the error in step 1 is a phantom error.

Responses to Errors

There are various different ways the system 100 can respond to completing a test and identifying errors.

In some embodiments, the method can include displaying an error. In some embodiments, the systems 100 can be configured to display an error message to a user, such as through the user interface 244.

In some embodiments, the method can include recording or documenting the error(s) found in the test routine. In some embodiments, the systems 100 can be configured to record or document the error(s) found in the test routine. The system 100 can create an error log that documents each of the errors found.

In some embodiments, the method can include remedying the errors found during testing. In some embodiments, the system 100 can be configured to remedy the errors found during the testing. Errors can be remedied in various ways including having a user respond to an error message by fixing the error, replacing a part of a circuit that is a portion of the error causing circuit, and adjusting or adding a part in a circuit connected to a problematic circuit. In some embodiments, the user interface can display a wiring schematic associated with one or more of the error causing circuits. In some embodiments, an error can be remedied by replacing missing or misplaced wires. As an example, in some scenarios, wire A is supposed to be in slot 5 and be part of network 1. However, wire A is in slot 6 and, as a result, is located in the wrong network. The wire can be moved from slot 6 and into slot 5 to remedy the error.

In some embodiments, the error can be a result of a mechanical failure or defect. In some embodiments, a connector can be replaced. In some cases, one or more strands of wire can be loose causing a short or other problem. In some cases, the insulation on a wire can be defective. These issues can be resolved by replacing a defective part.

Tests for the System

Various embodiments of the system 100 can be used implement different tests. In some embodiments, the system 100 can be used to implement an insulation test. In some embodiments, the system 100 can be used to implement a high potential (hipot) test. The system 100 can further be used to implement other tests using similar principles. In some embodiments, the system 100 can be used to check for shorts and/or opens in the networks.

Applications

The systems and methods described herein can be incorporated in various different applications. In some embodiments, the systems and methods can be used to test circuits in an aerospace device, such as an airplane, a helicopter, or a missile. In some embodiments, the system and methods can be used to test circuits in an automotive application. The system and methods described herein can be used in various industries that require reliable testing of numerous circuits.

It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

As used herein, the recitation of numerical ranges by endpoints shall include all numbers subsumed within that range (e.g., 2 to 8 includes 2.1, 2.8, 5.3, 7, etc.).

The headings used herein are provided for consistency with suggestions under 37 CFR 1.77 or otherwise to provide organizational cues. These headings shall not be viewed to limit or characterize the invention(s) set out in any claims that may issue from this disclosure. As an example, although the headings refer to a "Field," such claims should not be limited by the language chosen under this heading to describe the so-called technical field. Further, a description of a technology in the "Background" is not an admission that technology is prior art to any invention(s) in this disclosure. Neither is the "Summary" to be considered as a characterization of the invention(s) set forth in issued claims.

The embodiments described herein are not intended to be exhaustive or to limit the invention to the precise forms disclosed in the following detailed description. Rather, the embodiments are chosen and described so that others skilled in the art can appreciate and understand the principles and practices. As such, aspects have been described with reference to various specific and preferred embodiments and techniques. However, it should be understood that many variations and modifications may be made while remaining within the spirit and scope herein.

The invention claimed is:

1. A system for analyzing an electrical wiring harness assembly, the system comprising:

(a) a harness interface for contacting two or more pins of the electrical wiring harness, wherein the electrical wiring harness comprises a plurality of contacts, each contact is electrically connected to one of a plurality of networks;

(b) a stimulus and measurement device connected to the harness interface and configured to measure electrical characteristics of the electrical wiring harness assembly;

(c) a processing element in communication with the stimulus and measurement device, the processing element being configure to:

i. divide the plurality of networks into a first portion of networks and a second portion of networks, ii. initiate an electrical signal to one of the first portion or the second portion of the networks, iii. measure the electrical signal at the other of the first portion or the second portion of the networks, iv. compare the measured electrical signal at the other of the first portion or the second portion of the networks to an expected electrical signal to determine a difference, and v. if the difference is greater than a threshold difference, record an error.

2. The system according to claim 1, wherein the processing element is further configured to display an error message on a user interface.

3. The system according to claim 2, wherein the processing element is further configured to:

retrieve an electrical schematic for a network having an error from a database of electrical schematics; and display the retrieved electrical schematic on the user interface.

4. The system according to claim 1, wherein, upon determining no error is present, the processing element is further configured to repeat the steps (i)-(iv) by continually dividing the plurality of networks into half first portion networks and half second portion networks, wherein each division of the plurality of networks includes a unique combination of networks in the first portion of networks and a unique combination of networks in the second portion of networks until each network is in a different portion from every other network at least one time for steps (ii)-(v).

5. The system according to claim 4, wherein a network that is associated with a network that has previously been determined to have an error is removed from the plurality of networks that are divided into first portion networks and second portion networks for all subsequent repetitions of steps (i)-(v).

6. The system according to claim 1, wherein upon determining an error, the processing element is further configured to determine specifically which combination of networks produces the error.

7. The system according to claim 6, wherein upon determining an error, the processing element is configured to:

vi. divide the plurality of second portions into a first half of second portion of networks and a second half of second portion of networks, vii. initiate an electrical signal to the first half of the second portion of the networks, viii. measure the electrical signal at the first portion of the networks, ix. compare the measured electrical signal at the first portion of the networks to an expected electrical signal to determine a difference, and x. if the difference is greater than a threshold difference, record an error.

8. The system according to claim 7, wherein upon determining no error exists between the first half of the second portion of the networks and the first portion of the networks, the second half of the second portion of the networks is evaluated against the first portions by having the processing element:

xi. initiate an electrical signal to the second half of the second portion of the networks, xii. measuring the electrical signal at the first portion of the networks, xiii. comparing the measured electrical signal at the first portion of the contacts to an expected electrical signal to determine a difference, and xiv. if the difference is greater than a threshold difference, recording an error.

9. The system of claim 7, wherein upon determining no error exists in the most recent iteration of steps (ii)-(v), the networks in the second portion of networks that were used in the most recent iteration of steps (ii)-(v) are removed from consideration for subsequent iterations of steps (ii)-(v) until the error can be attributed to two specific networks.

10. The system of claim 9, wherein upon determining that one specific second portion network is associated with the error, the processing element is configured to repeat the following steps until one specific first portion network is determined to be associated with the error:

i. divide the plurality of first portion networks into a first half of first portion of networks and a second half of first portion of networks, ii. initiate an electrical signal to the one specific second portion network, iii. measure the electrical signal at the first half of first portion of the networks, iv. compare the measured electrical signal at the first half of first portion of the networks to an expected electrical signal to determine a difference, and v. if the difference is greater than a threshold difference, record an error vi. if no error is found, repeat steps (ii)-(v) with the second half of first portion of networks.

11. The system of claim 10, the processor is configured to determine which additional network is associated with the error by comparing the one specific second portion network with half of the plurality of first portion of networks by repeating steps (ii)-(v), wherein if no error exists the first portions are removed from consideration and the one specific second portion network is compared with half of the remaining first portion networks.

12. The system according to claim 1, wherein upon determining an error, the processing element is further configured to determine specifically which combination of two networks produces the error.

13. The system of claim 1, wherein upon determining an error exists, the number of networks in the second portion of networks is reduced in half and steps (ii)-(v) are repeated.

14. The system of claim 1, wherein each of the different network circuits is a circuit in an aerospace device.

15. The system of claim 1, wherein an error is representative of a failure of an insultation test or a hi-pot test.

16. A system for analyzing an electrical wiring harness assembly, the system comprising:

(a) a harness interface for contacting two or more pins of the electrical wiring harness, wherein the electrical wiring harness comprises a plurality of contacts, each contact is electrically connected to one of a plurality of networks;

(b) a stimulus and measurement device connected to the harness interface and configured to measure electrical characteristics of the electrical wiring harness assembly;

(c) a processing element in communication with the stimulus and measurement device, the processing element being configure to:

i. divide the plurality of networks into an input portion of networks and an output portion of networks, ii. initiate an electrical signal to the output portion of the networks, iii. measure the electrical signal at the input portion of the networks, iv. compare the measured electrical signal at the input portion of the networks to an expected electrical signal to determine a difference, and v. record an error upon determining the difference is greater than a threshold difference.

17. The system according to claim 16, wherein the processing element is further configured to display an error message on a user interface.

18. The system according to claim 17, wherein the processing element is further configured to:

retrieve an electrical schematic for a network having an error from a database of electrical schematics; and display the retrieved electrical schematic on the user interface.

19. The system according to claim 16, wherein, upon determining no error is present, the processing element is further configured to repeat the steps (i)-(iv) by continually dividing the plurality of networks into half input portion networks and half output portion networks, wherein each division of the plurality of networks includes a unique combination of networks in the input portion of networks and a unique combination of networks in the output portion of networks until each network is in a different portion from every other network at least one time for steps (ii)-(v).

20. A system for analyzing an electrical wiring harness assembly, the system comprising:

(a) a harness interface for contacting two or more pins of the electrical wiring harness, wherein the electrical wiring harness comprising a first contact for an electrical connection to a first network, a second contact an electrical connection to a second network, a third contact an electrical connection to a third network, a fourth contact an electrical connection to a fourth network, a fifth contact an electrical connection to a fifth network, a sixth contact an electrical connection to a sixth network, a seventh contact an electrical connection to a seventh network, and an eighth contact an electrical connection to an eighth network;

(b) a stimulus and measurement device connected to the harness interface and configured to measure electrical characteristics of the electrical wiring harness assembly;

(c) a processing element in communication with the stimulus and measurement device, the processing element being configure to:

i. set the first network, the second network, the third network, and the fourth network as output networks, and the fifth network, the sixth network, the seventh network and the eighth network as input network, ii. initiate an electrical signal to the output network, iii. measure the electrical signal at the input network, iv. compare the measured electrical signal at the input network to an expected electrical signal to determine a difference, and v. if the difference is greater than a threshold difference, record an error.

* * * * *